(12) United States Patent
Ho

(10) Patent No.: US 11,145,605 B2
(45) Date of Patent: Oct. 12, 2021

(54) SEMICONDUCTOR DEVICE AND METHOD FOR FABRICATING THE SAME

(71) Applicant: NANYA TECHNOLOGY CORPORATION, New Taipei (TW)

(72) Inventor: Jar-Ming Ho, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 55 days.

(21) Appl. No.: 16/656,773

(22) Filed: Oct. 18, 2019

(65) Prior Publication Data

US 2021/0118813 A1  Apr. 22, 2021

(51) Int. Cl.
*H01L 23/00* (2006.01)
*H01L 23/522* (2006.01)
*H01L 23/64* (2006.01)

(52) U.S. Cl.
CPC ........ *H01L 23/562* (2013.01); *H01L 23/5223* (2013.01); *H01L 23/642* (2013.01)

(58) Field of Classification Search
CPC .. H01L 23/562; H01L 23/5223; H01L 23/642
See application file for complete search history.

(56) References Cited

U.S. PATENT DOCUMENTS

| 2016/0155712 | A1* | 6/2016 | Gietler | G01R 31/2831 |
| | | | | 257/48 |
| 2017/0309530 | A1* | 10/2017 | Ilkov | H01L 22/34 |
| 2017/0323835 | A1 | 11/2017 | Ogawa | |
| 2017/0345773 | A1* | 11/2017 | Baek | H01L 23/585 |
| 2019/0033365 | A1 | 1/2019 | Sanchez | |

FOREIGN PATENT DOCUMENTS

| CN | 102695967 A | 9/2012 |
| CN | 104891420 A | 9/2015 |
| CN | 105655330 A | 6/2016 |

OTHER PUBLICATIONS

Office Action corresponding to Chinese application No. 109127207 dated Feb. 26, 2021. (pp. 5).

* cited by examiner

*Primary Examiner* — Cuong Q Nguyen
*Assistant Examiner* — Peter M Albrecht
(74) *Attorney, Agent, or Firm* — Muncy, Geissler, Olds and Lowe, P.C.

(57) ABSTRACT

The present application discloses a semiconductor device and a method for fabricating the semiconductor device. The semiconductor device includes a substrate and a first crack-detecting structure positioned in the substrate and comprising a first capacitor unit. The first capacitor unit comprises a first bottom conductive layer positioned in the substrate, a first capacitor insulating layer surrounding the first bottom conductive layer, and a first buried plate surrounding the first capacitor insulating layer.

12 Claims, 41 Drawing Sheets

SEMICONDUCTOR DEVICE AND METHOD FOR FABRICATING THE SAME

TECHNICAL FIELD

The present disclosure relates to a semiconductor device and a method for fabricating the semiconductor device, and more particularly, to a semiconductor device with a crack-detecting structure and a method for fabricating the semiconductor device with a crack-detecting structure.

DISCUSSION OF THE BACKGROUND

Semiconductor devices are used in a variety of electronic applications, such as personal computers, cellular telephones, digital cameras, and other electronic equipment. During the production and/or operation of the semiconductor devices, cracks can occur and propagate in the semiconductor device. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate and a first crack-detecting structure positioned in the substrate and comprising a first capacitor unit. The first capacitor unit comprises a first bottom conductive layer positioned in the substrate, a first capacitor insulating layer surrounding the first bottom conductive layer, and a first buried plate surrounding the first capacitor insulating layer.

In some embodiments, the first crack-detecting structure further comprises a first switch unit positioned adjacent to the first capacitor unit and electrically coupled to the first capacitor unit.

In some embodiments, the semiconductor device further comprises a plurality of stress-dissipating structures positioned above the substrate and next to the first crack-detecting structure.

In some embodiments, the semiconductor device further comprises a plurality of guard structures positioned above the substrate and adjacent to the plurality of stress-dissipating structures.

In some embodiments, the semiconductor device further comprises a seal ring positioned on the substrate and between the plurality of stress-dissipating structures and the plurality of guard structures.

In some embodiments, the first switch unit comprises a first switch unit insulating layer positioned on the substrate, a first switch unit conductive layer positioned on the first switch unit insulating layer, a plurality of first switch unit spacers attached to sidewalls of the first switch unit insulating layer and sidewalls of the first switch unit conductive layer, and a plurality of first switch unit doped regions positioned in the substrate and adjacent to two edges of the first switch unit insulating layer.

In some embodiments, the first capacitor unit further comprises a first joint region connected to one of the plurality of first switch unit doped regions and positioned above the first bottom conductive layer.

In some embodiments, each one of the plurality of stress-dissipating structures comprises a dummy switch unit positioned on the substrate and a first dummy conductive line positioned on the dummy switch unit.

In some embodiments, each one of the plurality of stress-dissipating structures has a rectangular shape and extends along a first direction, wherein the plurality of stress-dissipating structures are separate from each other and lengths of the plurality of stress-dissipating structures are sequentially decreased along a second direction perpendicular to the first direction.

Another aspect of the present disclosure provides a semiconductor device including a substrate, a first crack-detecting structure positioned in the substrate and comprising a first capacitor unit, and a second crack-detecting structure positioned next to the first crack-detecting structure and comprising a second capacitor unit. The first capacitor unit comprises a first bottom conductive layer positioned in the substrate, a first capacitor insulating layer surrounding the first bottom conductive layer, and a first buried plate surrounding the first capacitor insulating layer. The second capacitor unit comprises a second bottom conductive layer positioned next to the first bottom conductive layer, a second capacitor insulating layer surrounding the second bottom conductive layer, and a second buried plate surrounding the second capacitor insulating layer.

In some embodiments, the semiconductor device further comprises a connecting doped region positioned in the substrate and between the first capacitor unit and the second capacitor unit, wherein the connecting doped region is electrically coupled to the second capacitor unit.

In some embodiments, the first capacitor unit further comprises a first collar conductive layer positioned on the first bottom conductive layer, wherein the first capacitor insulating layer is attached to lower portions of sidewalls of the first collar conductive layer.

In some embodiments, the first capacitor unit further comprises a plurality of first insulating collars adjacent to the first collar conductive layer and attached to sidewalls of the first capacitor insulating layer.

In some embodiments, the first capacitor unit further comprises a first strap layer positioned on the first collar conductive layer.

In some embodiments, the first capacitor unit further comprises a first cover layer positioned on the first strap layer, wherein a top surface of the first cover layer is even with a top surface of the substrate.

In some embodiments, the semiconductor device further comprises a connecting contact positioned above the connecting doped region and electrically coupled to the connecting doped region.

In some embodiments, the semiconductor device further comprises a connecting conductive layer positioned above the connecting contact and electrically coupled to the connecting doped region.

In some embodiments, the semiconductor device further comprises an isolation layer positioned in the substrate and electrically insulated the connecting doped region and the first collar conductive layer.

Another aspect of the present disclosure provides a method for fabricating a semiconductor device including providing a substrate and forming a first crack-detecting structure comprising a first capacitor unit in the substrate. The first capacitor unit comprises a first bottom conductive layer positioned in the substrate, a first capacitor insulating layer surrounding the first bottom conductive layer, and a first buried plate surrounding the first capacitor insulating layer.

In some embodiments, the method for fabricating the semiconductor device further comprises forming a plurality of stress-dissipating structures next to the first crack-detecting structure.

Due to the design of the semiconductor device of the present disclosure, it is possible to detect cracks electrically by testing the electrical characteristics, and the efficiency of manufacturing the semiconductor device may be thereby improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
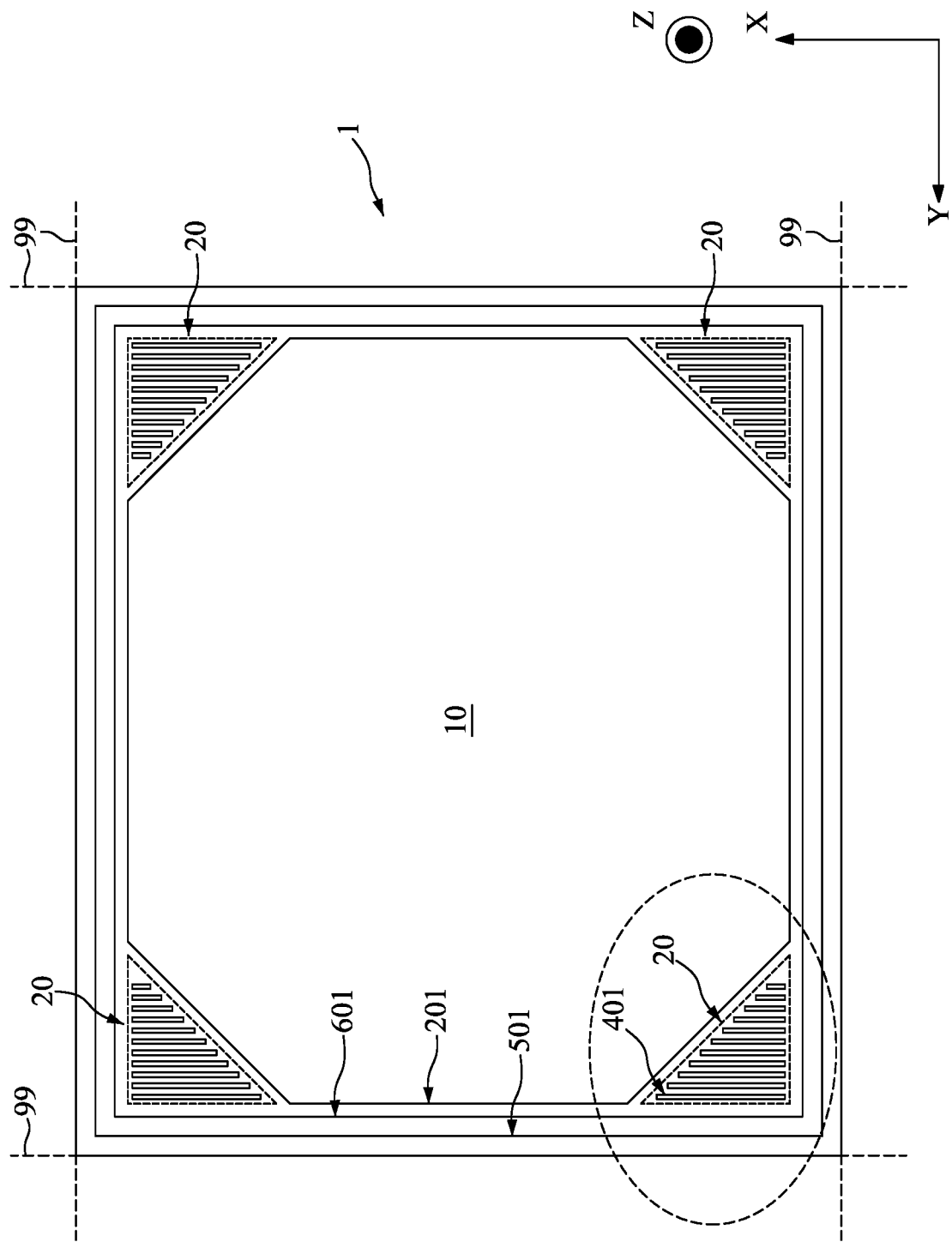
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to," or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Processes of forming integrated circuit devices may include a die sawing process for cutting a wafer into a plurality of chips. During a die sawing process, a sawing blade may cut a wafer along a scribe line to physically separate the wafer.

Figure 2:
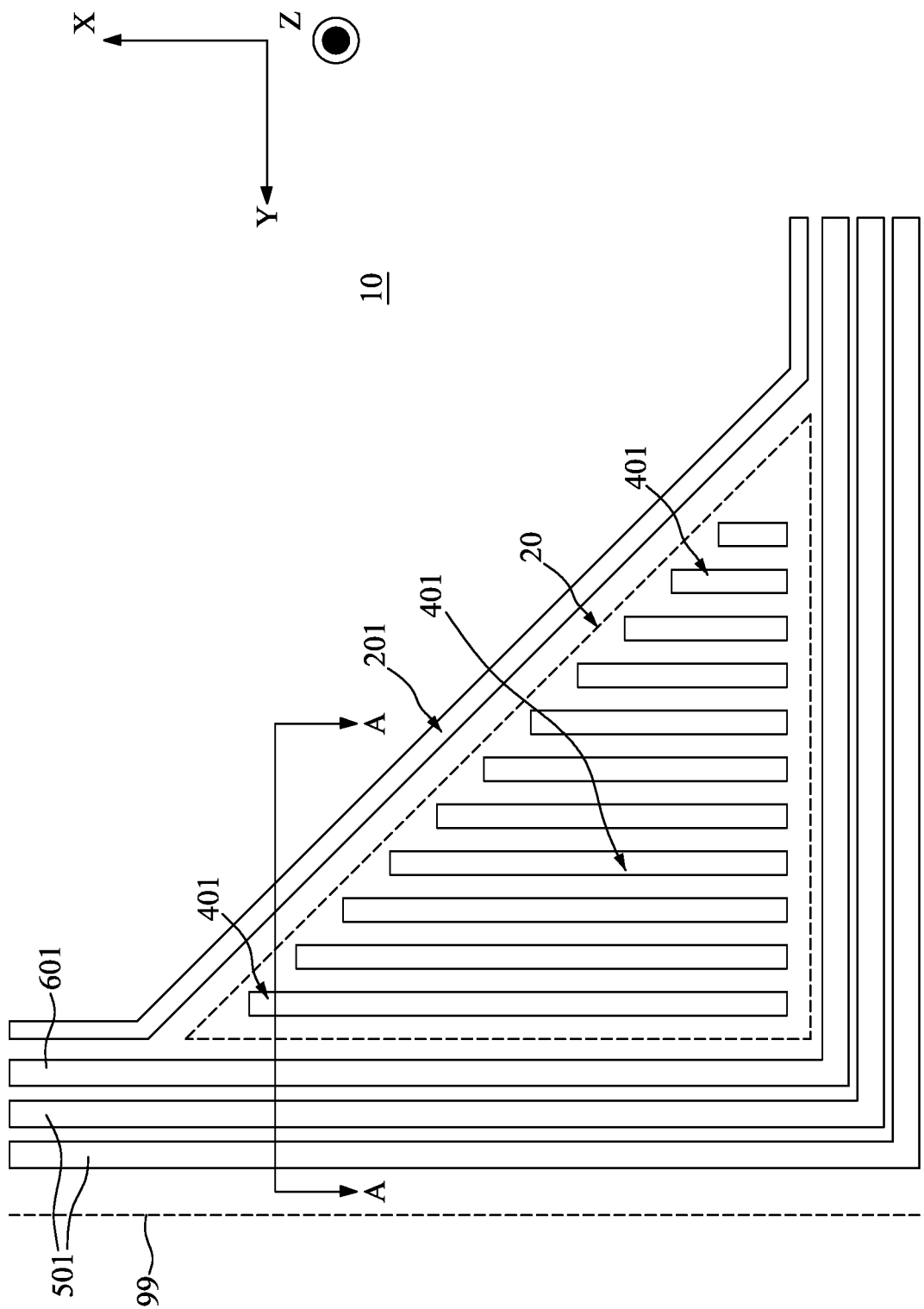
FIG. 2 illustrates, in a schematic zoomed-in top-view diagram, the semiconductor device in accordance with one embodiment of the present disclosure.
Figure 3:
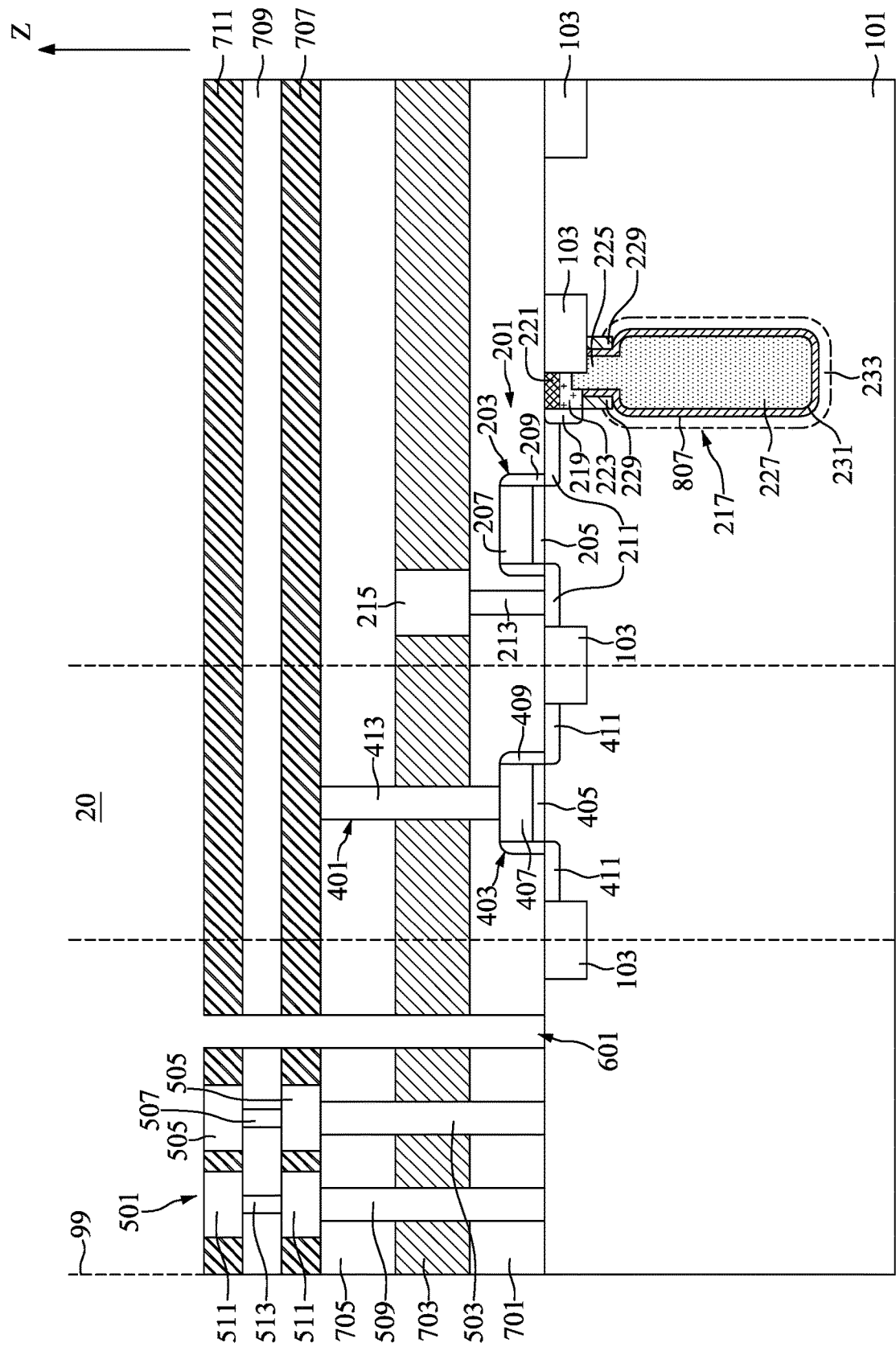
FIG. 3 illustrates, in a schematic cross-sectional view diagram, the semiconductor device in accordance with FIG. 2.

FIG. 1 illustrates, in a schematic top-view diagram, a semiconductor device 1 in accordance with one embodiment of the present disclosure. FIG. 2 illustrates, in a schematic zoomed-in top-view diagram, the semiconductor device 1 in accordance with one embodiment of the present disclosure. FIG. 3 illustrates, in a schematic cross-sectional view diagram, the semiconductor device 1 in accordance with FIG. 2.

With reference to FIGS. 1 and 2, in the embodiment depicted, the semiconductor device 1 may be a single chip before a sawing process. A plurality of scribe lines 99 may respectively extend along a first direction X and a second direction Y perpendicular to the first direction X to define edges of the semiconductor device 1. In other words, the plurality of scribe lines 99 may define a shape of the semiconductor device 1. In the embodiment depicted, the semiconductor device 1 may have a square shape. The semiconductor device 1, as seen from a top-view perspective, may include a central region 10, a plurality of chamfer regions 20, a first crack-detecting structure 201, a plurality of stress-dissipating structures 401, a plurality of guard structures 501, and a seal ring 601.

With reference to FIGS. 1 and 2, in the embodiment depicted, the central region 10 may be located at the center of the semiconductor device 1. A plurality of logic elements and a plurality of storage elements may be disposed at the central region 10. The plurality of chamfer regions 20 may be located at corners of the semiconductor device 1. In the embodiment depicted, the plurality of chamfer regions 20 may be located at four corners of the central region 10. The first crack-detecting structure 201 may surround the central region 10. In the embodiment depicted, each of the corner portions of the first crack-detecting structure 201 may be implemented as a chamfering shape; that is, the first crack-detecting structure 201 may have an octagonal shape. The first crack-detecting structure 201 may electrically couple to an external signal sensing device to determine whether cracks exist in the semiconductor device 1.

With reference to FIGS. 1 and 2, in the embodiment depicted, the plurality of stress-dissipating structures 401 may be located at the plurality of chamfer regions 20. The seal ring 601 may have a square shape and surround the first crack-detecting structure 201 and the plurality of chamfer regions 20. The plurality of chamfer regions 20 may be located between the first crack-detecting structure 201 and the seal ring 601. That is, shapes or regions of the plurality of chamfer regions 20 may be defined by the first crack-detecting structure 201 and the seal ring 601. The plurality of guard structures 501 may have a square shape and surround the seal ring 601. The plurality of guard structures 501 may be located next to the plurality of scribe lines 99.

With reference to FIG. 2, in the embodiment depicted, the plurality of stress-dissipating structures 401 may be located next to the first crack-detecting structure 201. Each one of the plurality of stress-dissipating structures 401 may have a rectangular shape. The plurality of stress-dissipating structures 401 may extend along the first direction X and may be separate from each other. Lengths of the plurality of stress-dissipating structures 401 may be sequentially decreased along the second direction Y.

With reference to FIG. 3, in the embodiment depicted, the semiconductor device 1, as viewed in a cross-sectional perspective, may include a substrate 101, an isolation layer 103, the first crack-detecting structure 201, the plurality of stress-dissipating structures 401 (only shown one in the cross-sectional diagram as FIG. 3), the plurality of guard structures 501, and a plurality of insulating films. The substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The isolation layer 103 may be disposed in the substrate 101. The substrate 101 may be formed of, for example, an insulating material such as silicon oxide, silicon nitride, silicon oxynitride, silicon nitride oxide, or fluoride-dopedsilicate.

With reference to FIG. 3, in the embodiment depicted, the plurality of insulating films may be stacked films including, from bottom to top, a first insulating film 701, a second insulating film 703, a third insulating film 705, a fourth insulating film 707, a fifth insulating film 709, and a sixth insulating film 711. The plurality of insulating films may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but are not limited thereto.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 3, in the embodiment depicted, the first crack-detecting structure 201 may be disposed in the substrate 101 and may include a first switch unit 203 and a first capacitor unit 217. The first switch unit 203 and the first capacitor unit 217 may be electrically coupled to each other. The first switch unit 203 may include a first switch unit insulating layer 205, a first switch unit conductive layer 207, a plurality of first switch unit doped regions 211, a first switch unit contact 213, and a first switch unit conductive line 215.

With reference to FIG. 3, in the embodiment depicted, the first switch unit insulating layer 205 may be disposed on the substrate 101 and in the first insulating film 701. The first switch unit insulating layer 205 may be formed of, for example, silicon oxide, silicon nitride, silicon oxynitride, silicon nitride oxide, or the like. Alternatively, in another embodiment, the first switch unit insulating layer 205 may be formed of an insulating material having a dielectric constant of about 4.0 or greater. The insulating material having a dielectric constant of about 4.0 or greater may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or a mixture thereof. The first switch unit insulating layer 205 may have a thickness between about 0.1 nm and about 10 nm. Preferably, the thickness of the first switch unit insulating layer 205 may be between about 0.1 nm and 3 nm.

With reference to FIG. 3, in the embodiment depicted, the first switch unit conductive layer 207 may be disposed on the first switch unit insulating layer 205 and in the first insulating film 701. The first switch unit conductive layer 207 may be formed of, for example, doped polysilicon. The first switch unit conductive layer 207 may be electrically coupled to an external voltage source which determines an on/off status of the first switch unit 203. The plurality of first switch unit spacers 209 may be disposed in the first insulating film 701. The plurality of first switch unit spacers 209 may be attached to sidewalls of the first switch unit conductive layer 207 and sidewalls of the first switch unit insulating layer 205. The plurality of first switch unit spacers 209 may be formed of, for example, silicon oxide, silicon nitride, silicon oxynitride, silicon nitride oxide, fluoride-doped silicate, or the like.

With reference to FIG. 3, in the embodiment depicted, the plurality of first switch unit doped regions 211 may be disposed in the substrate 101 and respectively correspondingly adjacent to two edges of the first switch unit insulating layer 205. The plurality of first switch unit doped regions 211 may separate from each other. The plurality of first switch unit doped regions 211 may have a first electrical type. In the embodiment depicted, the plurality of first switch unit doped regions 211 may be doped with a dopant such as phosphorus, arsenic, or antimony. The first electrical type may be n type.

With reference to FIG. 3, in the embodiment depicted, the first switch unit contact 213 may be disposed in the first insulating film 701. The first switch unit contact 213 may be disposed on one of the plurality of first switch unit doped regions 211 and electrically coupled to the one of the plurality of first switch unit doped regions 211. The first switch unit contact 213 may be formed of, for example, a conductive material such as doped polysilicon, metal, metal nitride, or metal silicide. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like. The first switch unit conductive line 215 may be disposed on the first switch unit contact 213 and in the second insulating film 703. The first switch unit conductive line 215 may be formed of a conductive material such as tungsten, aluminum, copper, nickel, or cobalt. The first switch unit conductive line 215 may be electrically coupled to the first switch unit contact 213 and an external signal sensing device.

With reference to FIG. 3, in the embodiment depicted, the first capacitor unit 217 may be disposed in the substrate 101 and may include a first joint region 219, a first cover layer 221, a first strap layer 223, a first collar conductive layer 225, a first bottom conductive layer 227, a plurality of first insulating collars 229, a first capacitor insulating layer 231, and a first buried plate 233. The first joint region 219 may be disposed adjacent to another one of the plurality of first switch unit doped regions 211 and electrically coupled to the other one of the plurality of first switch unit doped regions 211. The first joint region 219 may have a same electrical type as the plurality of first switch unit doped regions 211. The first cover layer 221 may be disposed adjacent to the first joint region 219. A top surface of the first cover layer 221 may be even with a top surface of the substrate 101. The first cover layer 221 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, organo silicate glass, or a combination thereof, but is not limited thereto. Alternatively, in another embodiment, the first cover layer 221 may be formed of an insulating material having a dielectric constant of about 4.0 or greater.

With reference to FIG. 3, in the embodiment depicted, the first strap layer 223 may be disposed below the first cover layer 221 and electrically connected to the first joint region 219. The first strap layer 223 may have a same electrical type as the first joint region 219. The first collar conductive layer 225 may be disposed below the first strap layer 223 and may be electrically connected to the first strap layer 223. The first collar conductive layer 225 may be formed of, for example, polysilicon or polysilicon germanium. The first collar conductive layer 225 may have a same electrical type as the first strap layer 223. The first bottom conductive layer 227 may be disposed below the first collar conductive layer 225 and electrically connected to the first collar conductive layer 225. The first bottom conductive layer 227 may be formed of, for example, polysilicon or polysilicon germanium. The first bottom conductive layer 227 may have a width greater than a width of the first collar conductive layer 225 and a same electrical type as the first collar conductive layer 225.

Alternatively, in another embodiment, the first collar conductive layer 225 and the first bottom conductive layer 227 may be formed of a material from the class containing metal borides, metal phosphides, and metal antimonides of the transition metals from the secondary groups IV, V and VI of the periodic table. The transition metals may be titanium, zirconium, hafnium, vanadium, niobium, tantalum, chromium, molybdenum, or tungsten. Specifically, the material may be titanium diboride, zirconium diboride, hafnium diboride, titanium phosphide, zirconium phosphide, hafnium phosphide, titanium antimonide, zirconium antimonide, or hafnium antimonide. The first collar conductive layer 225 and the first bottom conductive layer 227 formed of the aforementioned material may have a high thermal stability and excellent conductivity with a specific resistance of less than 20 μΩcm.

With reference to FIG. 3, in the embodiment depicted, the plurality of first insulating collars 229 may be disposed adjacent to two sidewalls of the first collar conductive layer 225 and attached to sidewalls of the first capacitor insulating layer 231. Bottoms of the plurality of first insulating collars 229 may be disposed above the first bottom conductive layer 227. The plurality of first insulating collars 229 may be formed of, for example, silicon oxide, silicon nitride, silicon oxynitride, silicon nitride oxide, fluoride-doped silicate, or the like. Alternatively, in another embodiment, the plurality of first insulating collars 229 may be formed of an insulating material having a dielectric constant of about 4.0 or greater.

With reference to FIG. 3, in the embodiment depicted, the first capacitor insulating layer 231 may surround lower portions of the two sidewalls of the first collar conductive layer 225 and an outer surface of the first bottom conductive layer 227. The first capacitor insulating layer 231 may be disposed between the first collar conductive layer 225 and the plurality of first insulating collars 229 and between the bottoms of the plurality of first insulating collars 229 and the first bottom conductive layer 227. The first capacitor insulating layer 231 may be formed of a same material as the plurality of first insulating collars 229, but is not limited thereto. In addition, a conductive layer (not shown in FIG. 3) including titanium phosphide and titanium nitride may be disposed between the first bottom conductive layer 227 and the first capacitor insulating layer 231 to improve the thermal stability and the conductivity of the first bottom conductive layer 227.

With reference to FIG. 3, in the embodiment depicted, the first buried plate 233 may surround the first bottom conductive layer 227 with the first capacitor insulating layer 231 interposed therebetween. In other words, the first buried plate 233 may surround the first capacitor insulating layer 231. Upper portions of the first buried plate 233 may connect to sidewalls of the plurality of first insulating collars 229. The first buried plate 233 may have a same electrical type as the first bottom conductive layer 227. The first buried plate 233 and the first bottom conductive layer 227 may be electrically insulated from each other by the first capacitor insulating layer 231. The plurality of first insulating collars 229 may prevent leakage current from forming between the first joint region 219 and the first buried plate 233.

With reference to FIG. 3, in the embodiment depicted, each one of the plurality of stress-dissipating structures 401 may include a dummy switch unit 403 and a first dummy conductive line 413. The dummy switch unit 403 may be disposed in the substrate 101 and the second insulating film 703. The first dummy conductive line 413 may be disposed on the dummy switch unit 403. The dummy switch unit 403 may include a dummy switch unit insulating layer 405, a dummy switch unit conductive layer 407, a plurality of dummy switch unit spacers 409, and a plurality of dummy switch unit doped regions 411.

With reference to FIG. 3, in the embodiment depicted, the dummy switch unit insulating layer 405 may be disposed on the substrate 101 and in the first insulating film 701. The dummy switch unit insulating layer 405 may be formed of a same material as the first switch unit insulating layer 205. The dummy switch unit conductive layer 407 may be disposed on the dummy switch unit insulating layer 405 and in the first insulating film 701. The dummy switch unit conductive layer 407 may be formed of a same material of the first switch unit conductive layer 207. The plurality of dummy switch unit spacers 409 may be attached to sidewalls of the dummy switch unit insulating layer 405 and sidewalls of the dummy switch unit conductive layer 407. The plurality of dummy switch unit spacers 409 may be formed of a same material of the plurality of first switch unit spacers 209.

With reference to FIG. 3, in the embodiment depicted, the plurality of dummy switch unit doped regions 411 may be disposed in the substrate 101 and respectively correspondingly adjacent to two edges of the dummy switch unit insulating layer 405. The plurality of dummy switch unit doped regions 411 may have a same electrical type as the plurality of first switch unit doped regions 211, but are not limited thereto. The first dummy conductive line 413 may be disposed on the dummy switch unit conductive layer 407 and extend through the third insulating film 705, the second insulating film 703, and the first insulating film 701. The first dummy conductive line 413 may be formed of, for example, doped polysilicon, titanium, titanium nitride, tantalum, tantalum nitride, tungsten, copper, aluminum or aluminum alloy.

During the sawing process, stress due to the sawing process along the first direction X and stress due to the sawing process along the second direction Y may accumulate in corner portions of the semiconductor device 1. Thus, cracks may occur in the corner portions of the semiconductor device 1 more frequently than in other portions of the semiconductor device 1. With the presence of the plurality of stress-dissipating structures 401 located at the chamfer regions 20, the stresses accumulated in the corner portions of the semiconductor device 1 may be dissipated. Hence, a reliability of the semiconductor device may be improved. In addition, the plurality of stress-dissipating structures 401 may reduce a loading effect during etch processes of fabricating the semiconductor device 1.

With reference to FIG. 3, in the embodiment depicted, the plurality of guard structures 501 may be disposed among the plurality of insulating films and may include a first guard plug 503, a plurality of first dummy guard conductive layers 505, a first dummy guard conductive via 507, a second guard plug 509, a plurality of second dummy guard conductive layers 511, and a second dummy guard conductive via 513. The first guard plug 503 and the second guard plug 509 may be disposed on the substrate 101 and separate from each other. The first guard plug 503 and the second guard plug 509 may be disposed extending through the third insulating film 705, the second insulating film 703, and the first insulating film 701. The first guard plug 503 and the second guard plug 509 may be formed of a same material as the first dummy conductive line 413, but are not limited thereto.

With reference to FIG. 3, in the embodiment depicted, the plurality of first dummy guard conductive layers 505 and the plurality of second dummy guard conductive layers 511 may be respectively correspondingly disposed in the sixth insulating film 711 and the fourth insulating film 707. A bottommost of the plurality of first dummy guard conductive layers 505 may be disposed on the first guard plug 503, and a bottommost of the plurality of second dummy guard conductive layers 511 may be disposed on the second guard plug 509. The plurality of first dummy guard conductive layers 505 and the plurality of second dummy guard conductive layers 511 may be formed of a same material as the first switch unit conductive line 215, but are not limited thereto. The first dummy guard conductive via 507 and the second dummy guard conductive via 513 may be respectively correspondingly disposed between the plurality of first dummy guard conductive layers 505 and the plurality of second dummy guard conductive layers 511. The first dummy guard conductive via 507 and second dummy guard conductive via 513 may be formed of a same material as the first switch unit contact 213, but are not limited thereto. The plurality of guard structures 501 may serve as physical buffers that allow the dissipation of energy or stress induced during processes such as the sawing process, a wire bonding process, a soldering process, or during rigorous environmental testing.

With reference to FIG. 3, in the embodiment depicted, the seal ring 601 may be disposed on the substrate 101 and between the plurality of stress-dissipating structures 401 and the plurality of guard structures 501. The seal ring 601 may be disposed penetrating through the sixth insulating film 711, the fifth insulating film 709, the fourth insulating film 707, the third insulating film 705, the second insulating film 703, and the first insulating film 701. The seal ring 601 may stop cracks from propagating toward the central region 10 or reduce the stress of the cracks, especially lateral stress.

Figure 4:
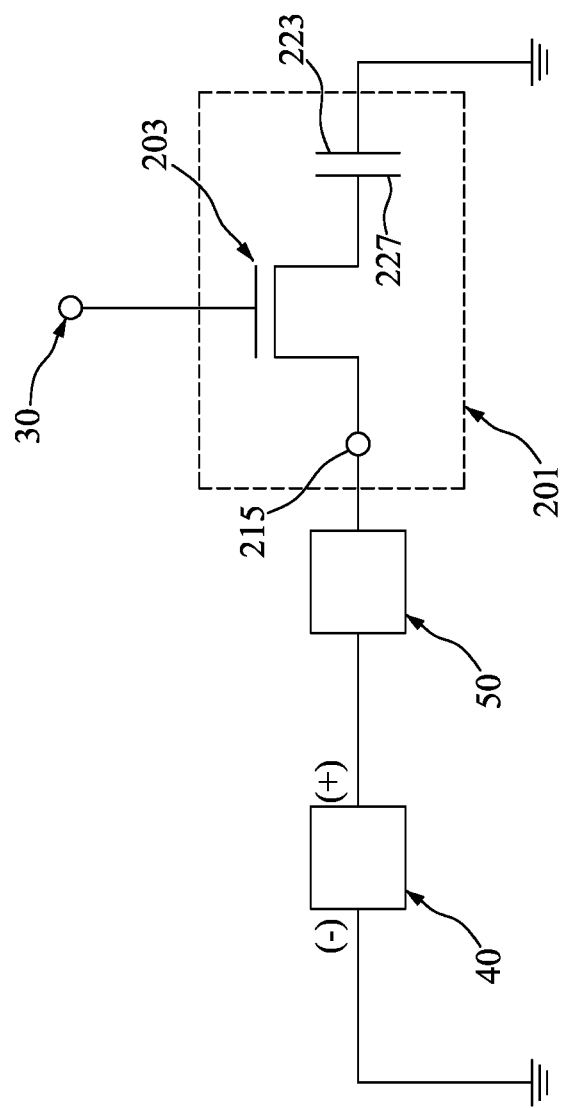
FIG. 4 illustrates, in a schematic circuit diagram, a semiconductor device without cracks in accordance with an embodiment of the present disclosure.
Figure 5:
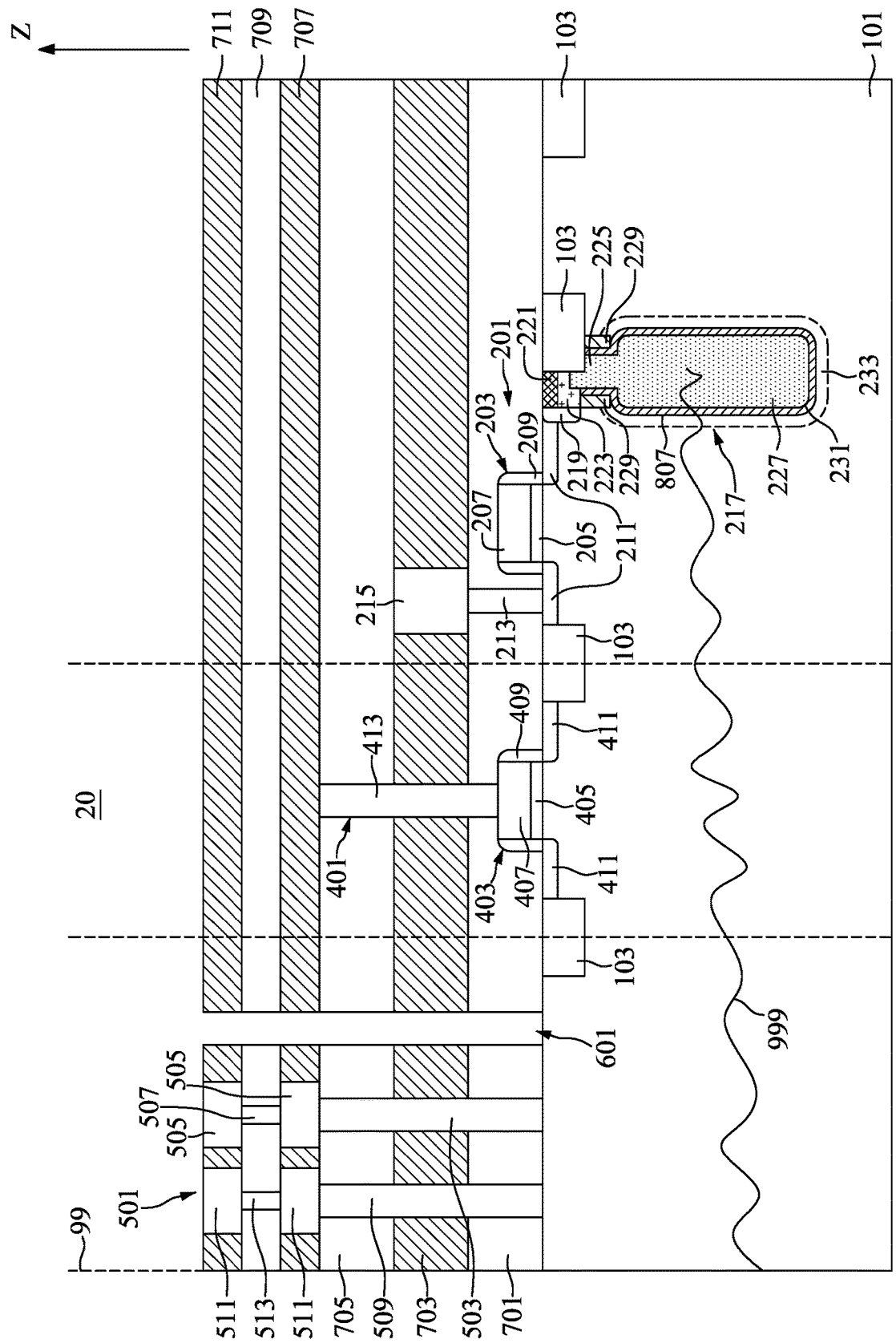
FIG. 5 illustrates, in a schematic cross-sectional view diagram including a depiction of a crack, the semiconductor device in accordance with an embodiment of the present disclosure.

FIG. 4 illustrates, in a schematic circuit diagram, a semiconductor device without cracks in accordance with an embodiment of the present disclosure, wherein the semiconductor device is coupled to a first external voltage source 30, a second external voltage source 40, and an external signal sensing device 50. FIG. 5 illustrates, in a schematic cross-sectional view diagram, the semiconductor device 1 including a crack 999 in accordance with an embodiment of the present disclosure.

With reference to FIG. 4, the first external voltage source 30 may be electrically coupled to the first switch unit 203 and may determine an on/off status of the first switch unit 203. The external signal sensing device 50 may be electrically coupled to the first crack-detecting structure 201 through the first switch unit conductive line 215. The external signal sensing device 50 may be a current detector or an impedance detector. The second external voltage source 40 may be electrically coupled to the first crack-detecting structure 201 through the external signal sensing device 50. The first buried plate 233 may be grounded. Without the presence of cracks as in FIG. 4, the first bottom conductive layer 227 and the first buried plate 233 may be electrically insulated by the first capacitor insulating layer 231; therefore, no signal can be read from the external signal sensing device 50. In contrast, when a crack 999 is propagating toward the central region 10 and extends through the first crack-detecting structure 201, the crack 999 may form a pathway electrically connecting the first bottom conductive layer 227 and the first buried plate 233. As a result, a signal can be read through the external signal sensing device 50.

Figure 6:
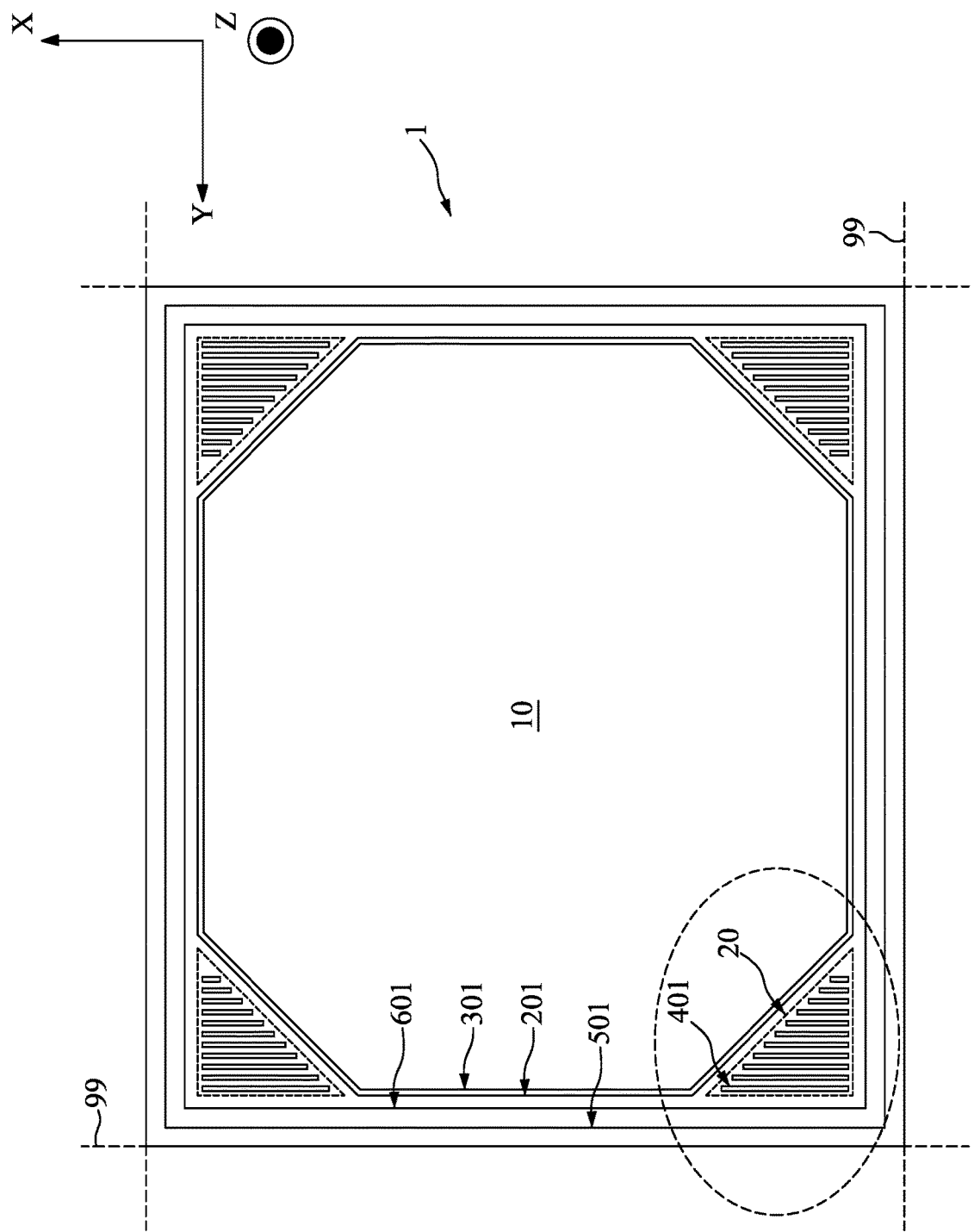
FIG. 6 illustrates, in a schematic top-view diagram, a semiconductor device in accordance with another embodiment of the present disclosure.
Figure 7:
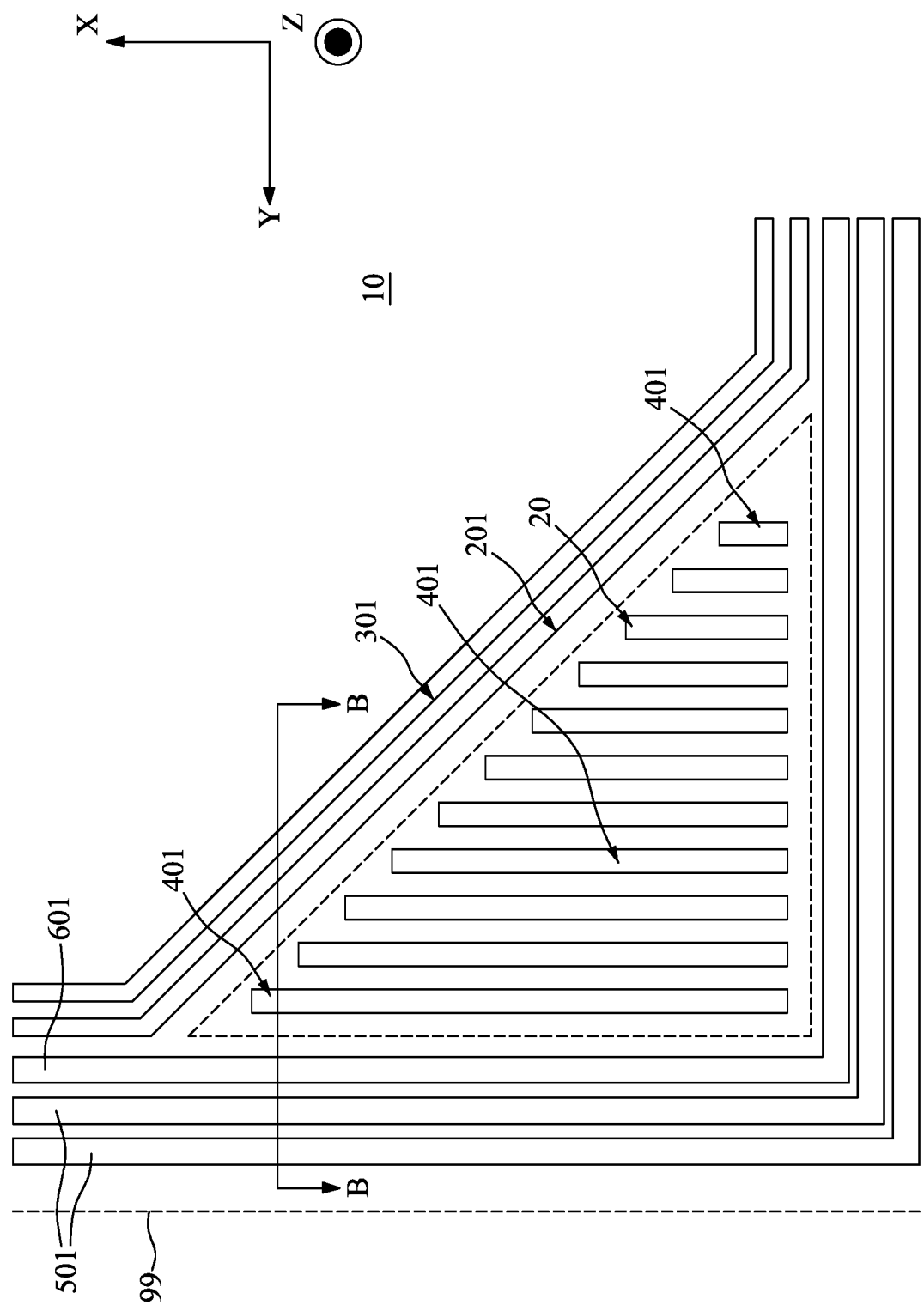
FIG. 7 illustrates, in a schematic zoomed-in top-view diagram, the semiconductor device in accordance with another embodiment of the present disclosure.
Figure 8:
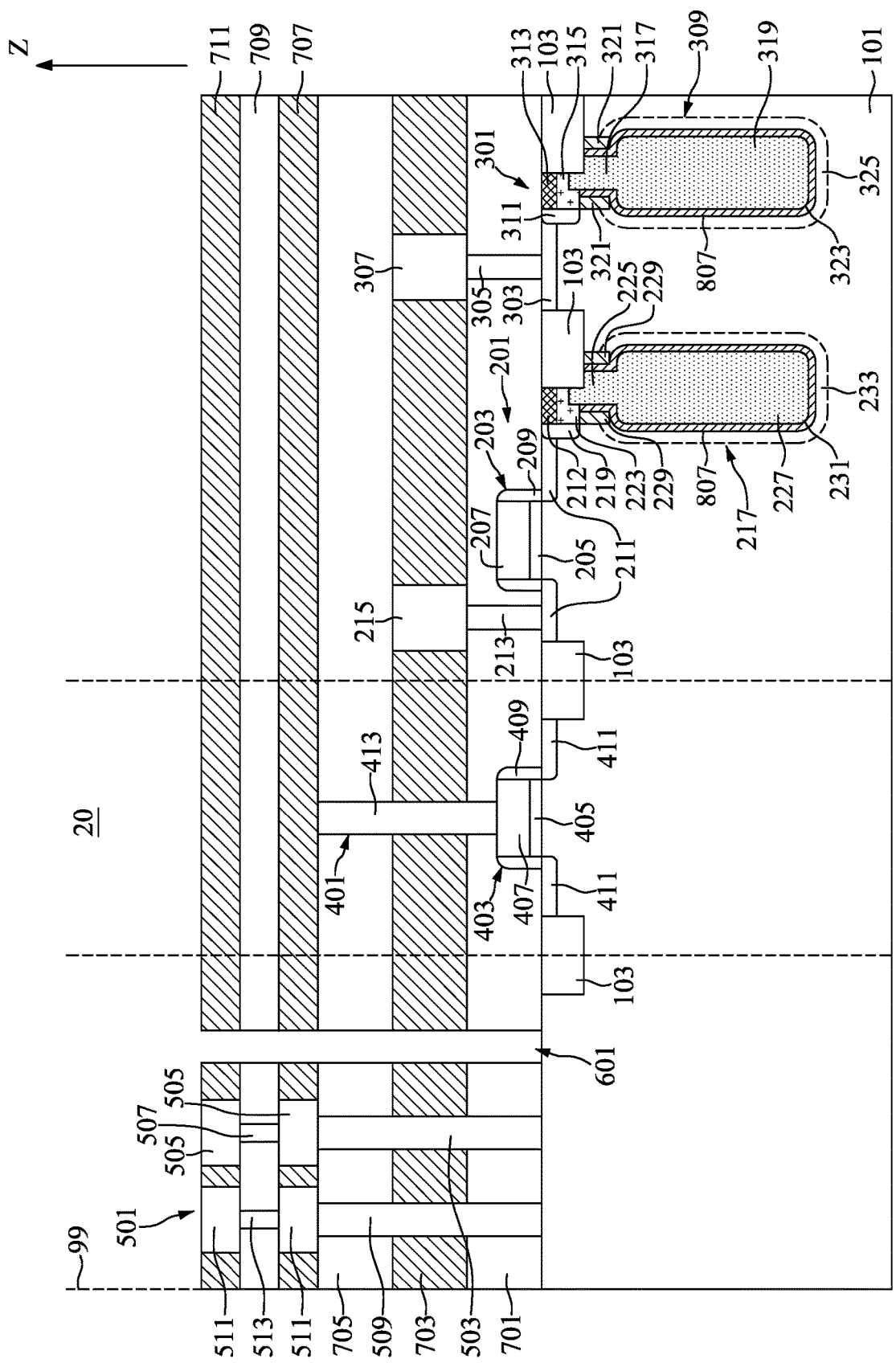
FIG. 8 illustrates, in a schematic cross-sectional view diagram, the semiconductor device in accordance with FIG. 7.

FIG. 6 illustrates, in a schematic top-view diagram, a semiconductor device 1 in accordance with another embodiment of the present disclosure. FIG. 7 illustrates, in a schematic zoomed-in top-view diagram, the semiconductor device 1 in accordance with another embodiment of the present disclosure. FIG. 8 illustrates, in a schematic cross-sectional view diagram, the semiconductor device 1 in accordance with FIG. 7.

With reference to FIGS. 6 to 8, the semiconductor device 1 further includes a second crack-detecting structure 301. The second crack-detecting structure 301 may be disposed between the first crack-detecting structure 201 and the central region 10. The second crack-detecting structure 301 may include a connecting doped region 303, a connecting contact 305, a connecting conductive layer 307, and a second capacitor unit 309. The connecting doped region 303 may be disposed in the substrate 101 and electrically insulated from the first capacitor unit 217 by the isolation layer 103. The connecting doped region 303 may have a same electrical type as the first joint region 219, but is not limited thereto.

With reference to FIG. 8, the connecting contact 305 may be disposed on the connecting doped region 303. The connecting contact 305 may be formed of a same material as the first switch unit contact 213, but is not limited thereto. The connecting conductive layer 307 may be disposed on the connecting contact 305. The connecting conductive layer 307 may be formed of a same material as the first switch unit conductive line 215, but is not limited thereto. The second capacitor unit 309 may be separate from the first capacitor unit 217, and may have a structure similar to that of the first capacitor unit 217, but is not limited thereto. The similar structures of the first capacitor unit 217 and the second capacitor unit 309 may be fabricated with similar semiconductor processes without increased complexity of the fabrication process of the semiconductor device 1. The second capacitor unit 309 may include a second joint region 311, a second cover layer 313, a second strap layer 315, a second collar conductive layer 317, a second bottom conductive layer 319, a plurality of second insulating collars 321, a second capacitor insulating layer 323, and a second buried plate 325.

With reference to FIG. 8, the second joint region 311 may be disposed adjacent to the connecting doped region 303 and opposite to the first joint region 219. The second joint region 311 may be formed of a same electrical type as the connecting doped region 303, but is not limited thereto. The second cover layer 313 may be disposed adjacent to the second joint region 311 and formed of a same material of the first cover layer 221, but is not limited thereto. A top surface of the second cover layer 313 may be even with the top surface of the substrate. The second strap layer 315 may be disposed below the second cover layer 313 and formed of a same material as the first strap layer 223, but is not limited thereto. The second collar conductive layer 317 may be disposed below the second strap layer 315 and formed of a same material as the first collar conductive layer 225, but is not limited thereto. The second bottom conductive layer 319 may be disposed below the second collar conductive layer 317 and formed of a same material as the first bottom conductive layer 227, but is not limited thereto. The plurality of second insulating collars 321 may be attached to two sidewalls of the second collar conductive layer 317 and formed of a same material as the plurality of first insulating collars 229, but are not limited thereto. The second capacitor insulating layer 323 may surround the second bottom conductive layer 319 and the two sidewalls of the second collar conductive layer 317. The second capacitor insulating layer 323 may be formed of a same material as the first capacitor insulating layer 231, but is not limited thereto. The second buried plate 325 may surround the second capacitor insulating layer 323 and may be formed of a same material as the first buried plate 233, but is not limited thereto.

Figure 9:
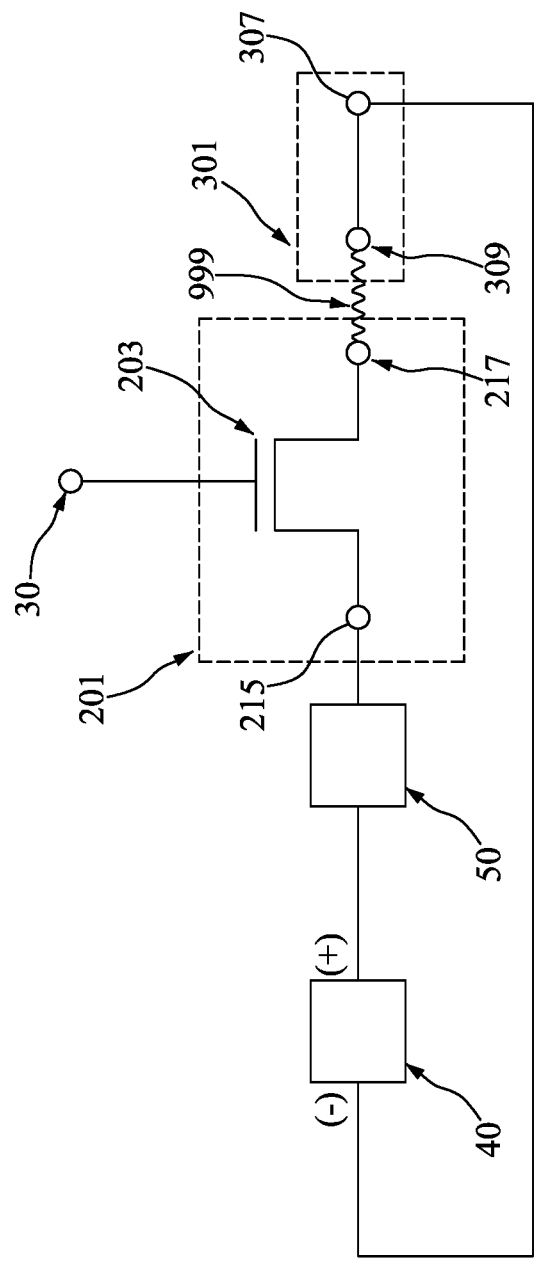
FIG. 9 illustrates, in a schematic circuit diagram, a semiconductor device including a depiction of a crack in accordance with an embodiment of the present disclosure.
Figure 10:
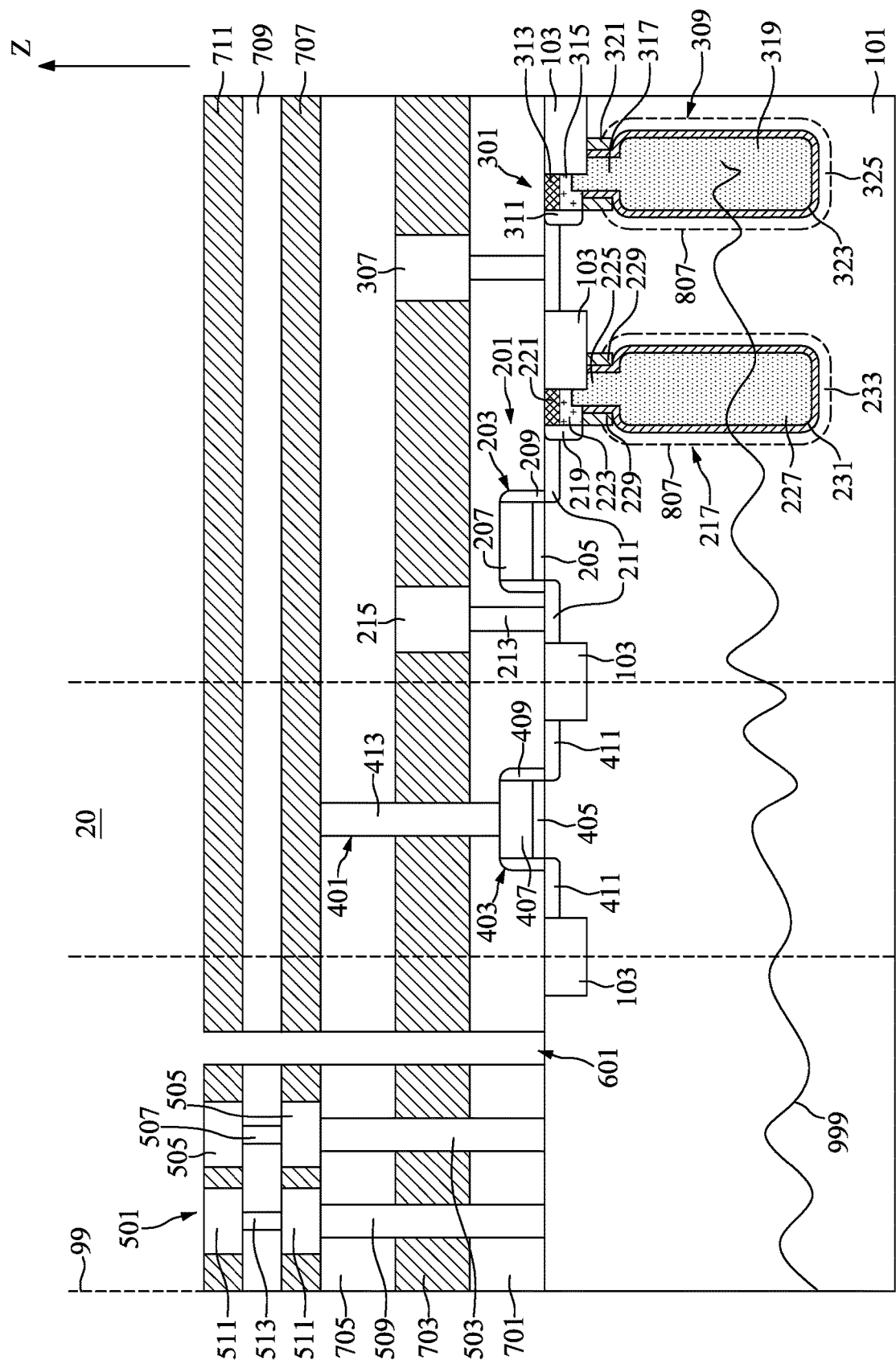
FIG. 10 illustrates, in a schematic cross-sectional view diagram including a depiction of the crack, the semiconductor device in accordance with an embodiment of the present disclosure.

FIG. 9 illustrates, in a schematic circuit diagram, a semiconductor device with a crack 999 in accordance with an embodiment of the present disclosure. The semiconductor device is coupled to a first external voltage source 30, a second external voltage source 40, and an external signal sensing device 50. FIG. 10 illustrates, in a schematic cross-sectional view diagram, the semiconductor device 1 with the crack 999 in accordance with an embodiment of the present disclosure.

With reference to FIG. 8, because no cracks exist in the semiconductor device 1, the first capacitor unit 217 and the second capacitor unit 309 may be regarded as two stand-alone elements without a pathway electrically connected to each other to form a circuit. With reference to FIGS. 9 and 10, the external signal sensing device 50 may be electrically coupled to the first crack-detecting structure 201 through the first switch unit conductive line 215. The second external voltage source 40 may be electrically coupled to the first crack-detecting structure 201 and the connecting conductive layer 307. When a crack 999 is propagating toward the central region 10 and extends through the first crack-detecting structure 201 and the second crack-detecting structure 301, the crack 999 may form a pathway electrically connecting the first capacitor unit 217 and the second capacitor unit 309 to form a circuit. As a result, a signal can be read through the external signal sensing device 50.

Figure 11:
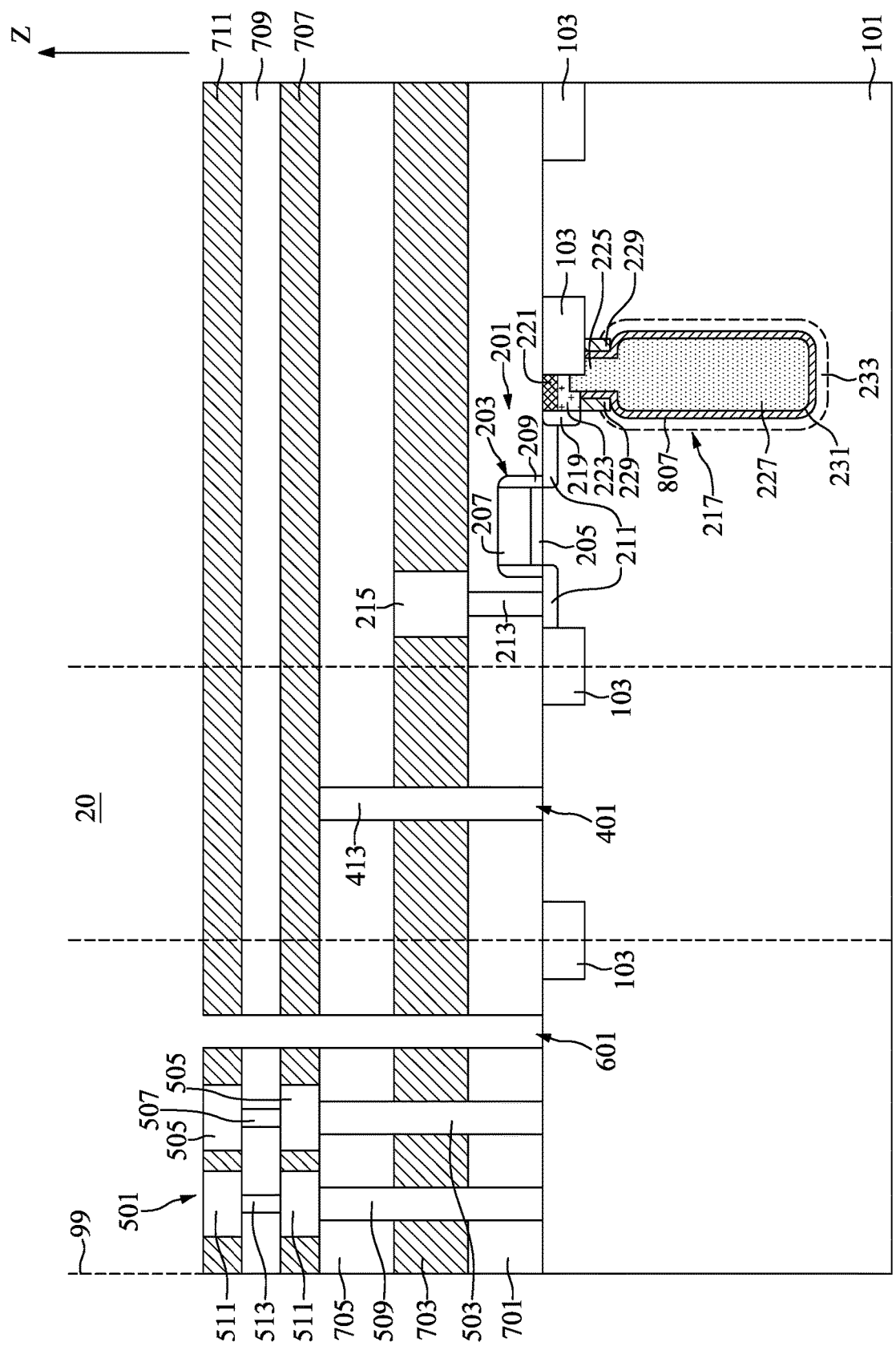
FIG. 11 illustrates, in a schematic cross-sectional view diagram, a semiconductor device in accordance with another embodiment of the present disclosure.
Figure 12:
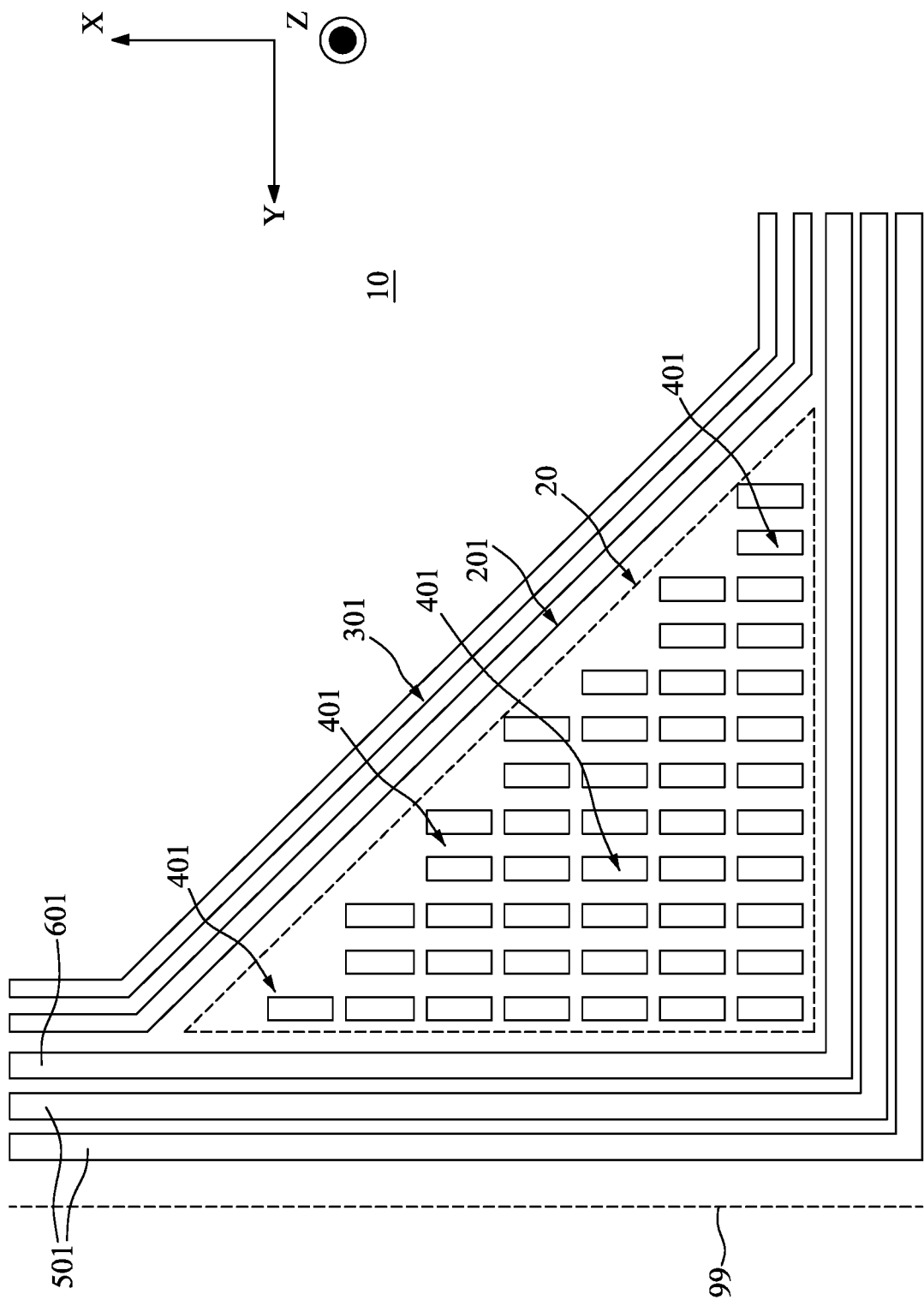
FIGS. 12 and 13 illustrate, in schematic zoomed-in top-view diagrams, semiconductor devices in accordance with some embodiments of the present disclosure.
Figure 13:
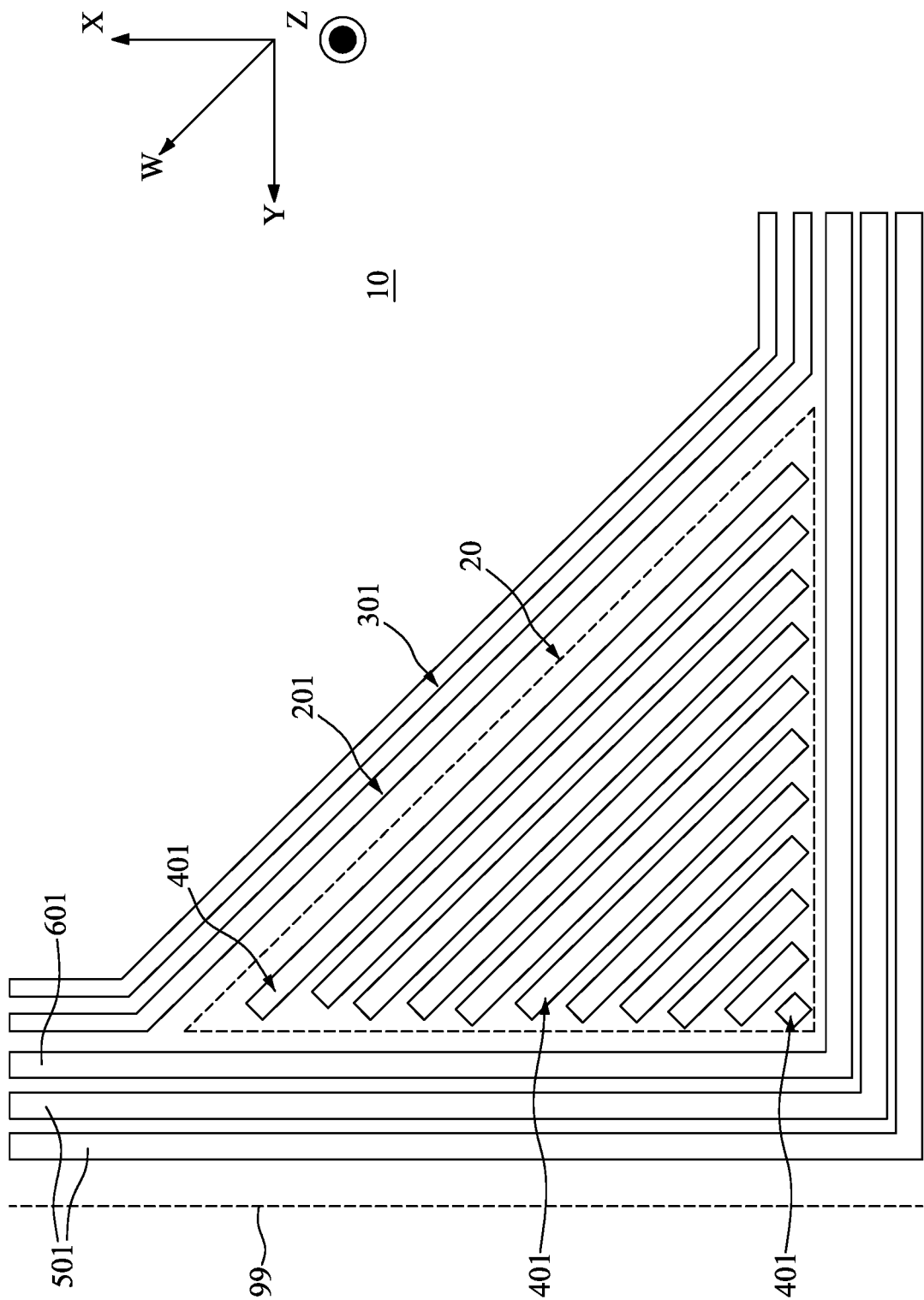

FIG. 11 illustrates, in a schematic cross-sectional view diagram, a semiconductor device 1 in accordance with another embodiment of the present disclosure. FIGS. 12 and 13 illustrate, in schematic zoomed-in top-view diagrams, a semiconductor device 1 in accordance with some embodiments of the present disclosure.

With reference to FIG. 11, each one of the plurality of stress-dissipating structures 401 may only include the first dummy conductive line 413 disposed on the substrate 101. The first dummy conductive line 413 may be disposed extending through the third insulating film 705, the second insulating film 703, and the first insulating film 701. Forming the plurality of stress-dissipating structures 401 only including the first dummy conductive line 413 may reduce a complexity of fabricating process of the semiconductor device 1.

With reference to FIG. 12, each one of the plurality of stress-dissipating structures 401 may have a rectangular shape. The plurality of stress-dissipating structures 401 may be separate from each other and may be respectively disposed along the first direction X and the second direction Y.

With reference to FIG. 13, each one of the plurality of stress-dissipating structures 401 may have a rectangular shape. The first dummy conductive line 413 may extend along a third direction W slanted in respect with the first direction X and the second direction Y. Lengths of the plurality of stress-dissipating structures 401 may be sequentially increased along a fourth direction perpendicular to the third direction W.

Figure 14:
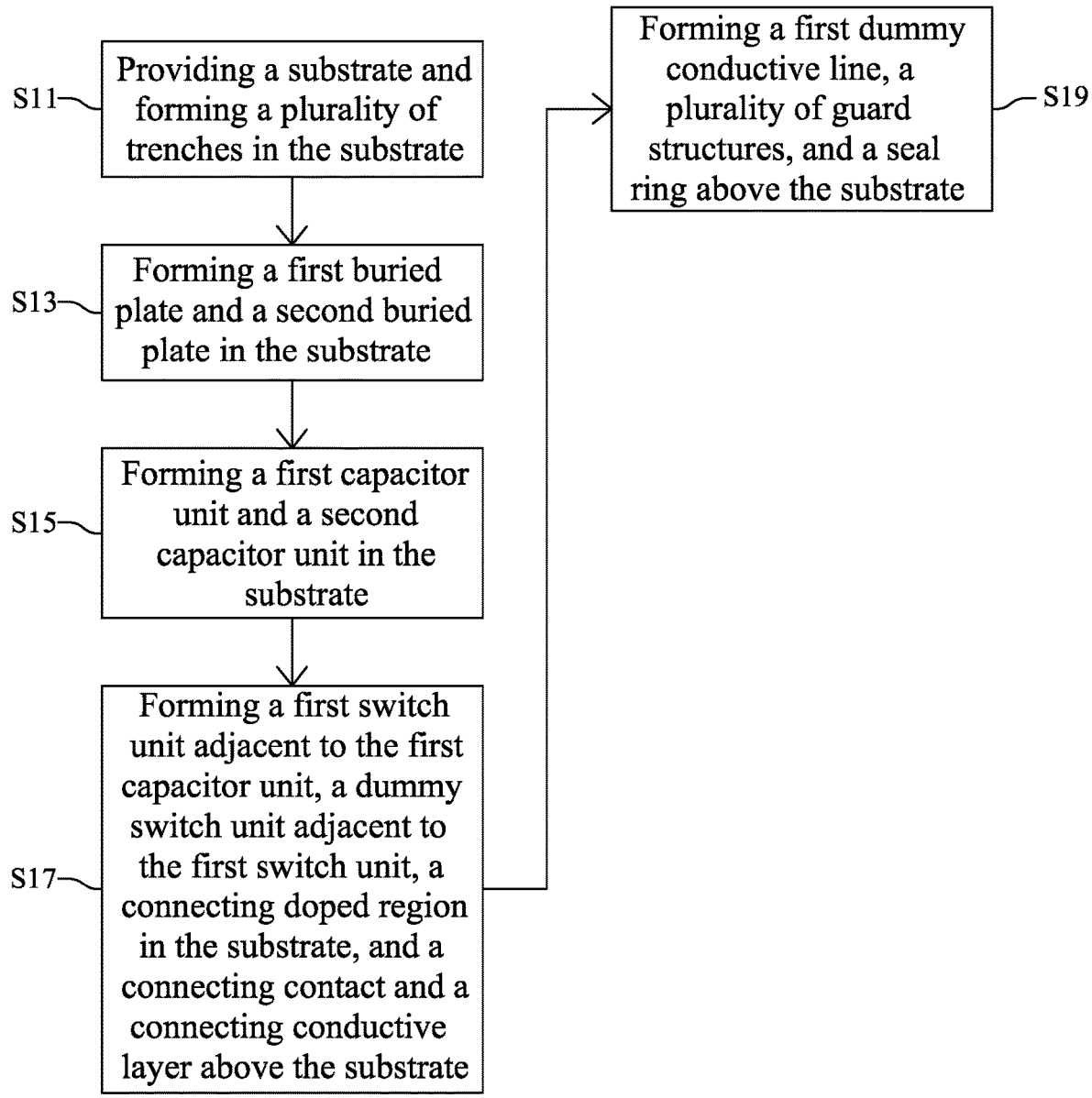
FIG. 14 illustrates, in a flowchart diagram form, a method for fabricating a semiconductor device in accordance with one embodiment of the present disclosure.

FIG. 14 illustrates, in a flowchart diagram form, a method 60 for fabricating a semiconductor device 1 in accordance with one embodiment of the present disclosure. FIGS. 15 to 41 illustrate, in schematic cross-sectional diagrams, a flow of fabricating a semiconductor device 1 in accordance with one embodiment of the present disclosure.

Figure 15:
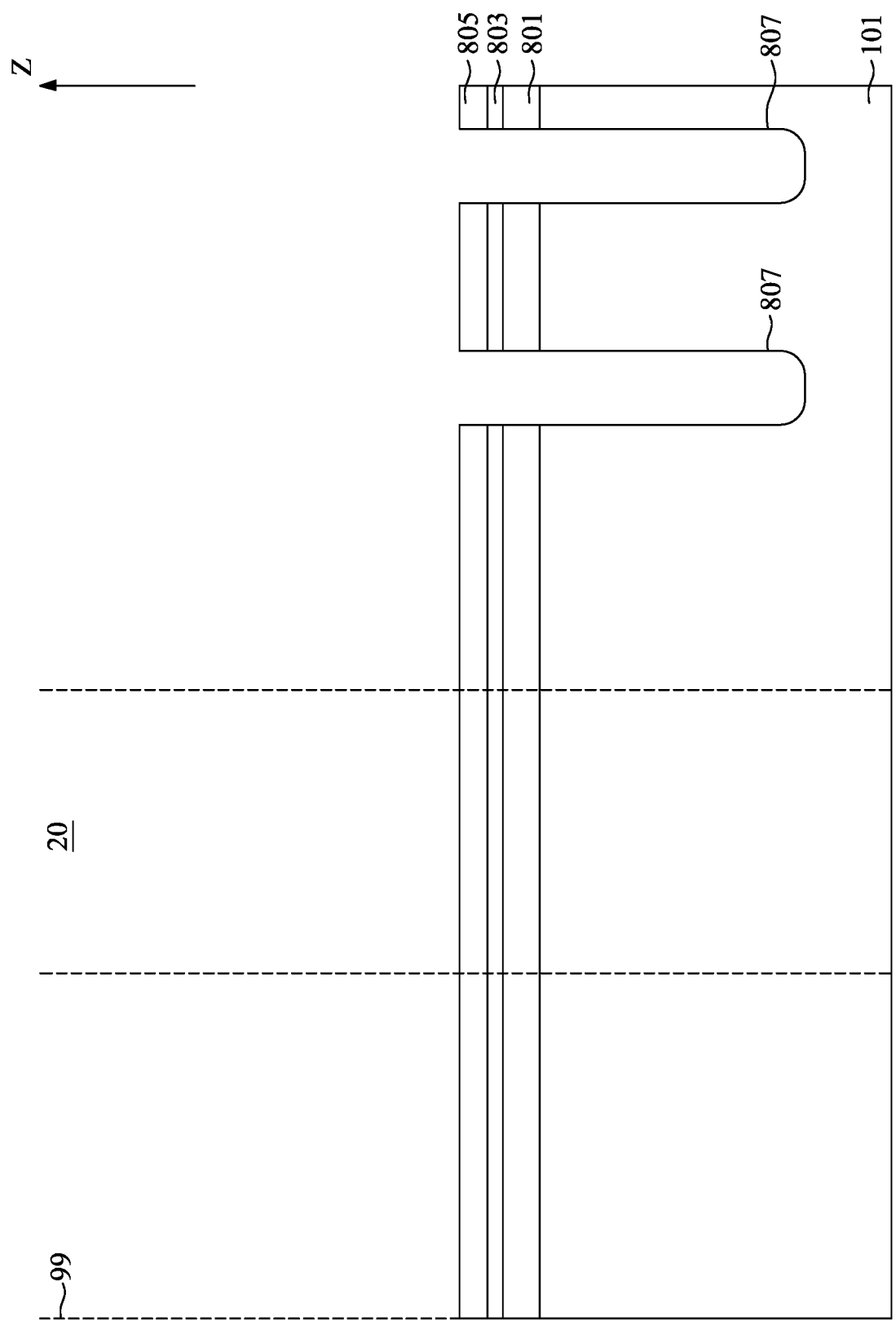
FIGS. 15 to 41 illustrate, in schematic cross-sectional diagrams, a flow of fabricating a semiconductor device in accordance with one embodiment of the present disclosure.

With reference to FIGS. 14 and 15, at step S11, in the embodiment depicted, a substrate 101 may be provided and a plurality of trenches 807 may be formed in the substrate 101. A first pad layer 801, a second pad layer 803, and a third pad layer 805 may be subsequentially formed on the substrate 101. The first pad layer 801 may be formed of, for example, silicon oxide. The second pad layer 803 may be formed of, for example, silicon nitride. The third pad layer 805 may be formed of, for example, silicon oxide. A photolithography process and an etch process may be performed to form the plurality of trenches 807 through the third pad layer 805, the second pad layer 803 and the first pad layer 801, and extending into the substrate 101.

Figure 16:
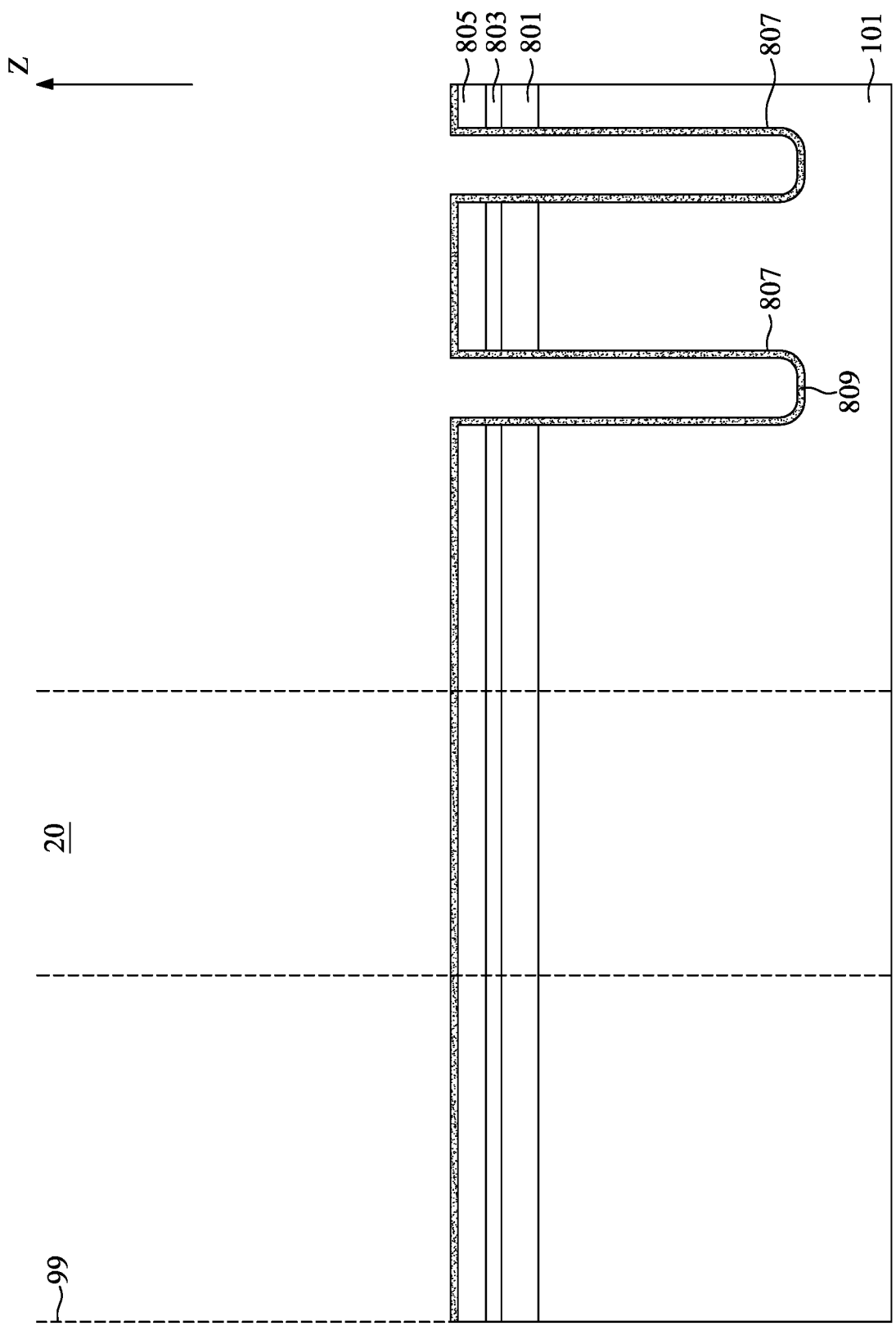
Figure 17:
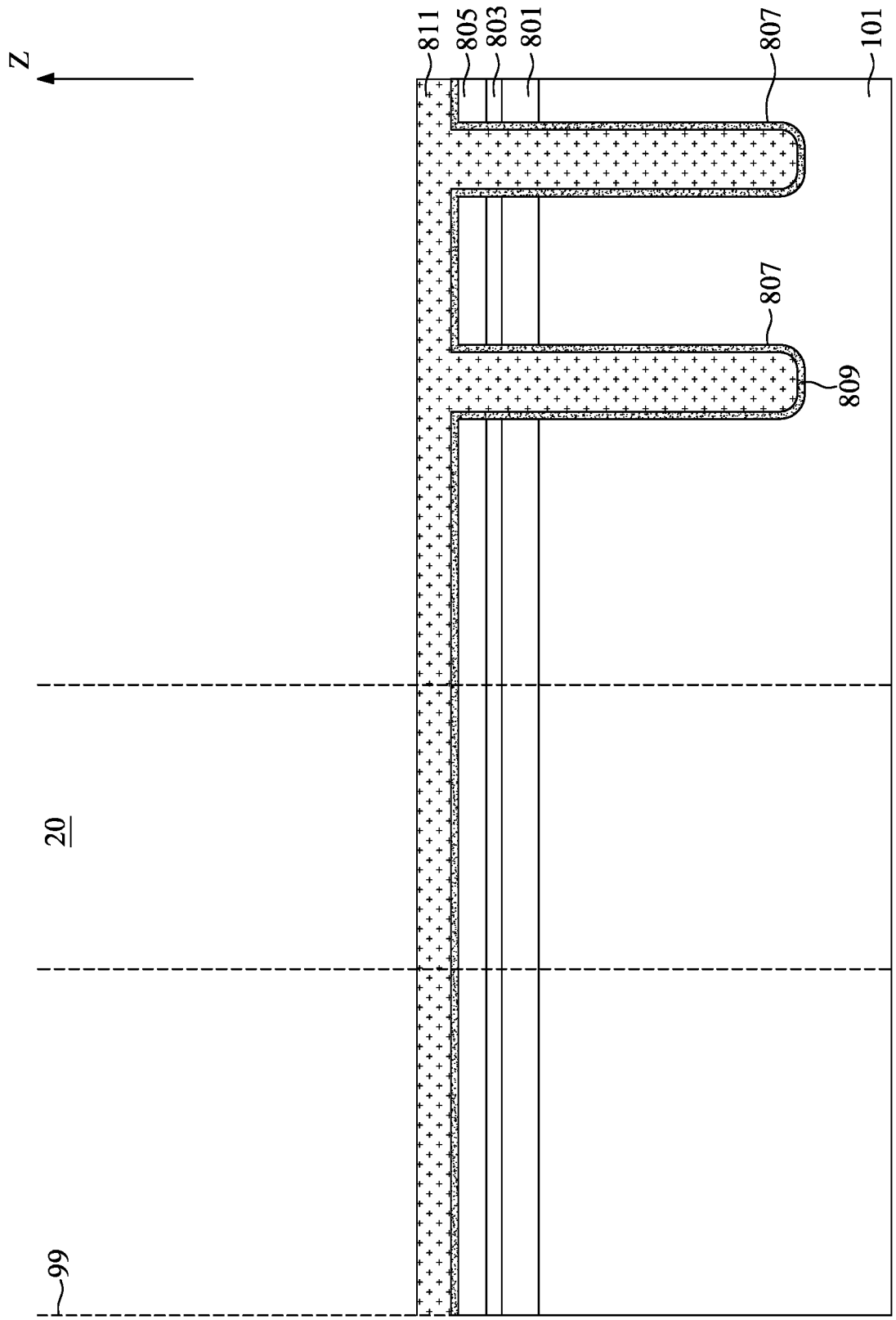
Figure 18:
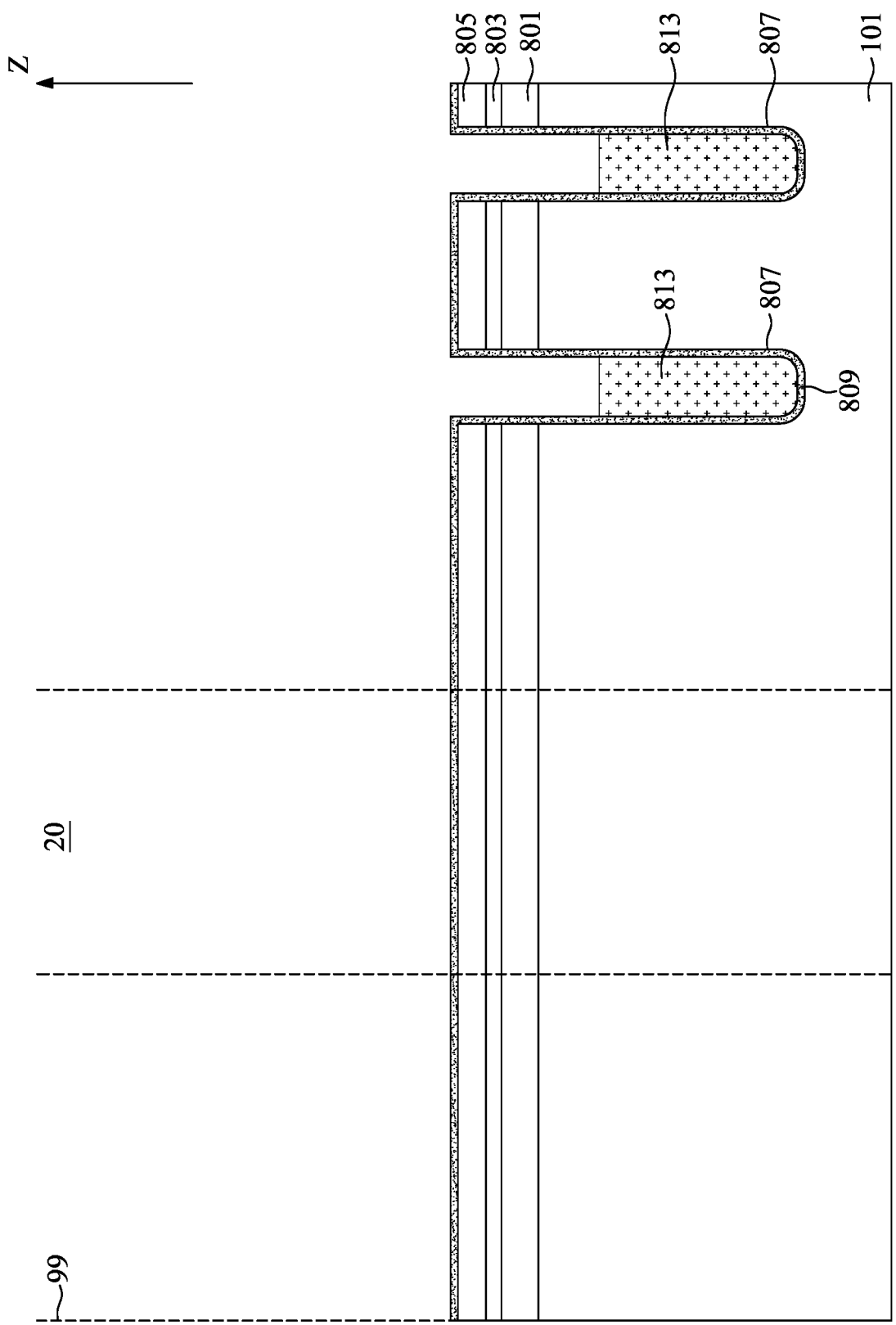

With reference to FIGS. 14, and 16 to 21, at step S13, in the embodiment depicted, a first buried plate 233 and a second buried plate 325 may be formed in the substrate 101. With reference to FIG. 16, a doping source layer 809 may be formed to align with a top surface of the third pad layer 805 and the plurality of trenches 807. The doping source layer 809 may be formed of, for example, arsenic silicate glass and may serve as a dopant source for forming the first buried plate 233 and the second buried plate 325. With reference to FIG. 17, a dummy layer 811 may be formed to fill the plurality of trenches 807 and cover the doping source layer 809. The dummy layer 811 may be formed of, for example, undoped polysilicon. With reference to FIG. 18, a plurality of recessed dummy layers 813 may be respectively correspondingly formed in the plurality of trenches 807. The dummy layer 811 may be partially removed by an isotropic dry etching process to form the plurality of recessed dummy layers 813.

Figure 19:
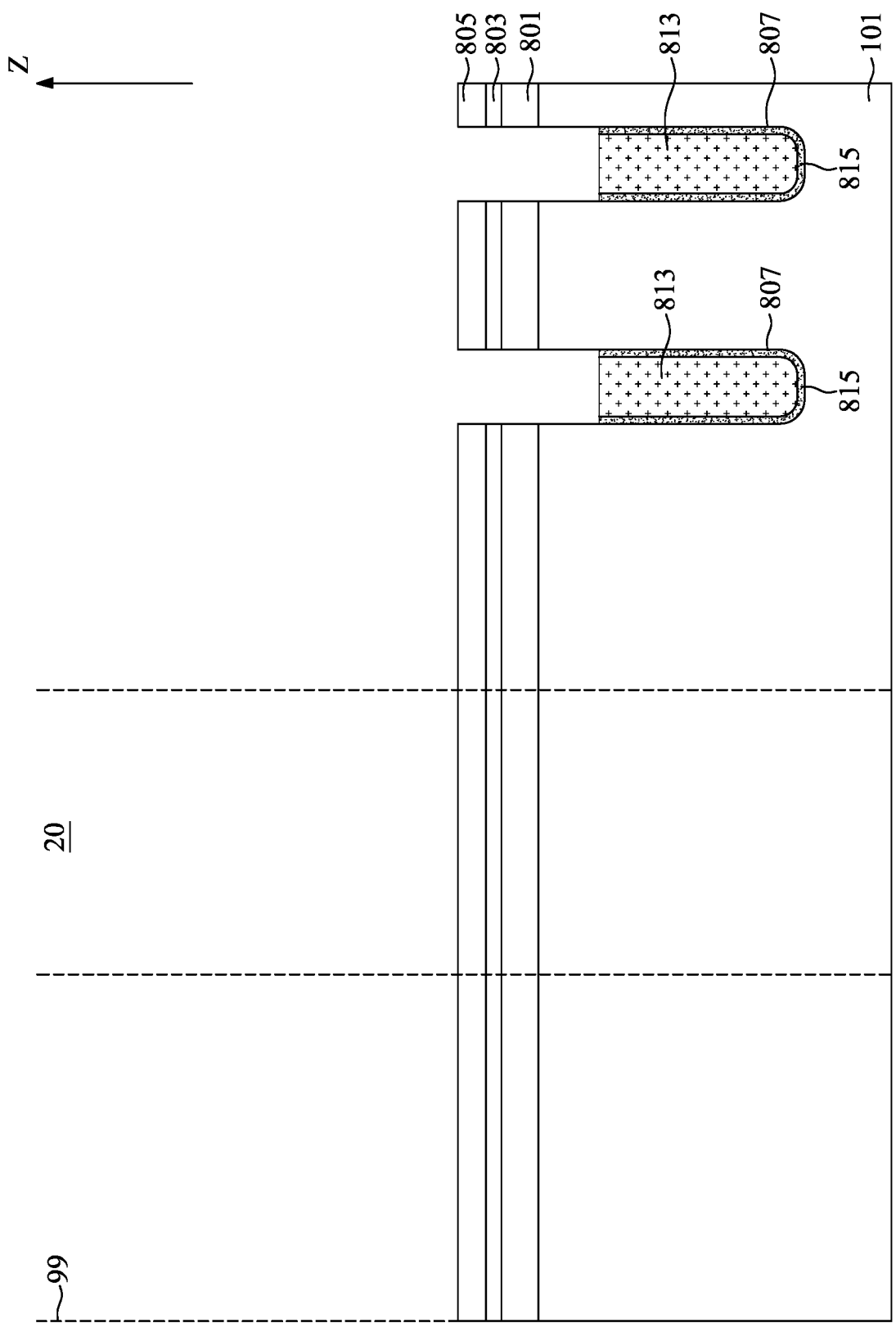
Figure 20:
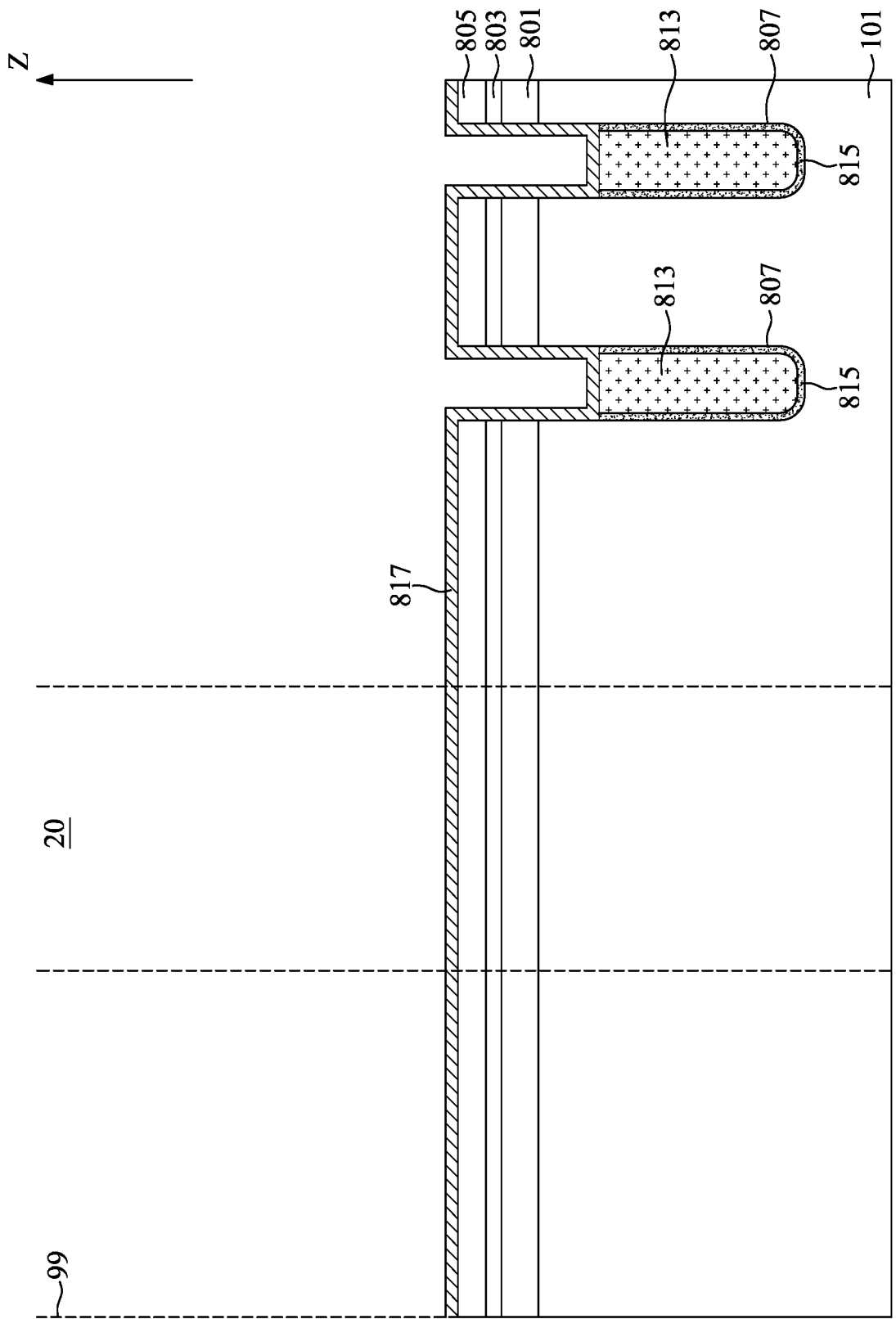
Figure 21:
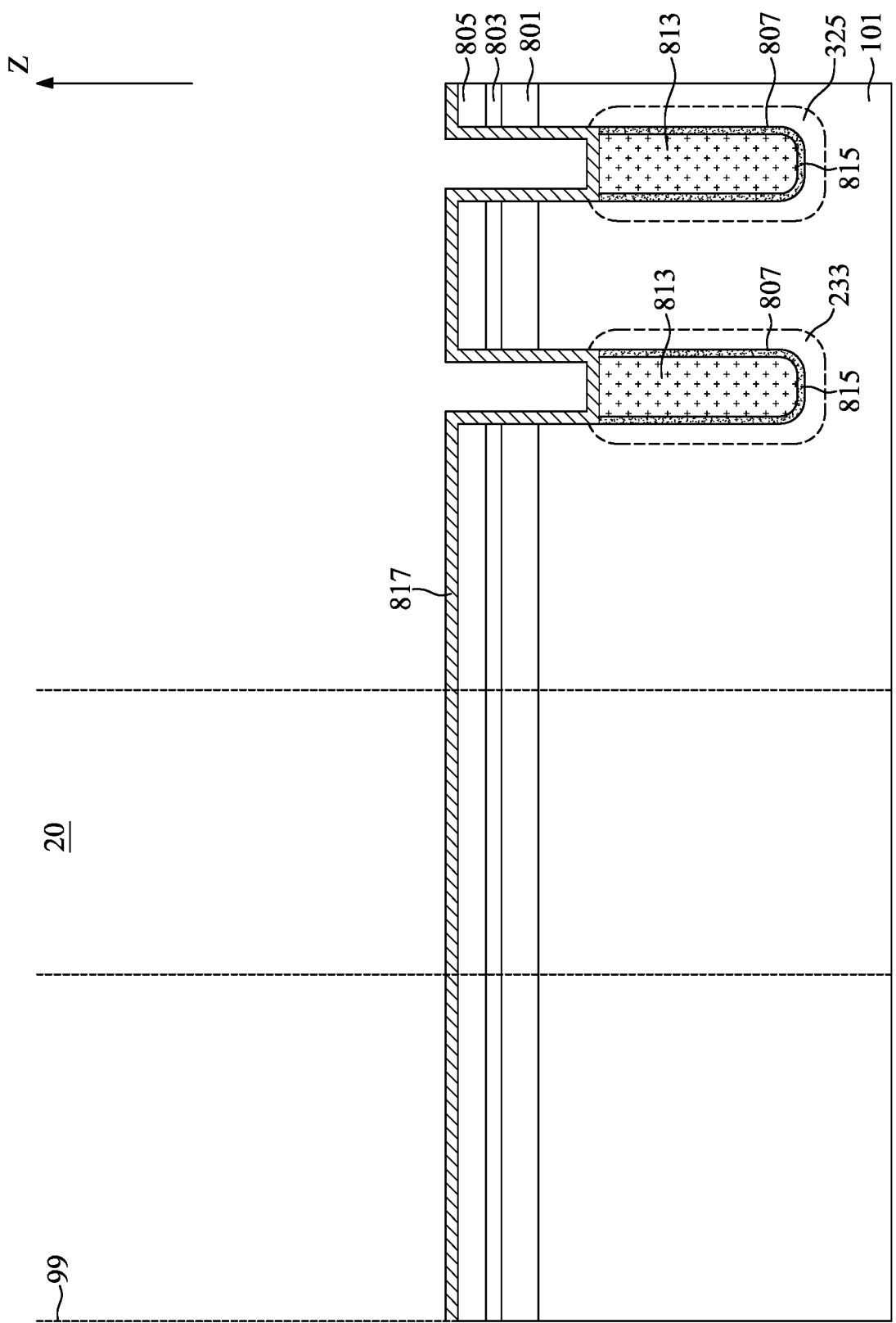

With reference to FIG. 19, a plurality of recessed doping source layers 815 may be respectively correspondingly formed in lower portions of the plurality of trenches 807. A wet etching process may be performed to partially remove the doping source layer 809 and form the plurality of recessed doping source layers 815. With reference to FIG. 20, a collar insulating layer 817 may be formed to align with the top surface of the third pad layer 805, upper portions of the plurality of trenches 807, and top surfaces of the plurality of recessed dummy layers 813 and the plurality of recessed doping source layers 815. With reference to FIG. 21, an annealing process may be performed to diffuse out the plurality of recessed doping source layers 815 and respectively correspondingly form the first buried plate 233 and the second buried plate 325 in regions surrounding the plurality of trenches 807.

Figure 22:
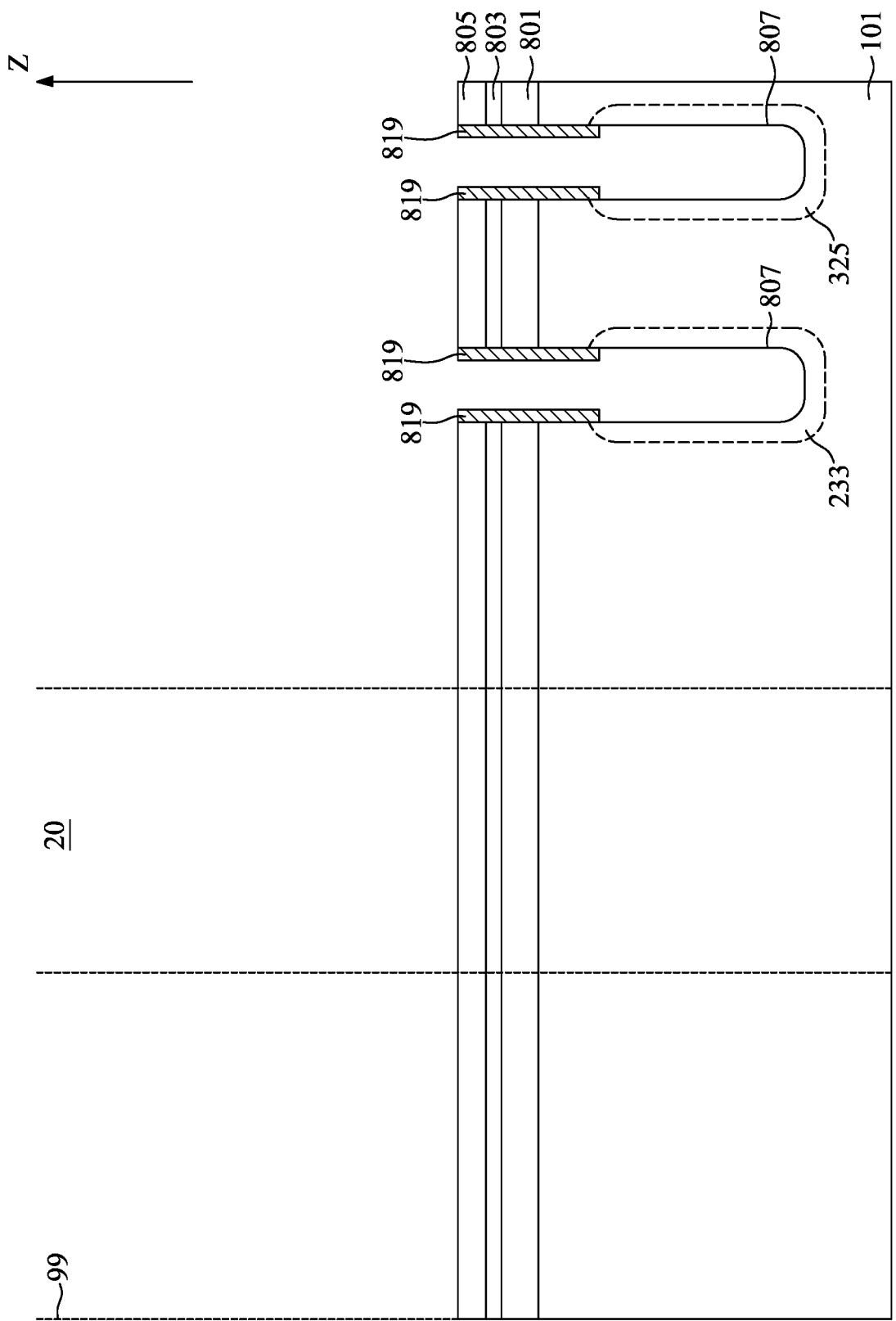

With reference to FIGS. 14 and 22 to 35, at step S15, in the embodiment depicted, a first capacitor unit 217 and a second capacitor unit 309 may be formed in the substrate 101. With reference to FIG. 22, a plurality of in-process collar insulating layers 819 may be formed in the upper portions of the plurality of trenches 807 by performing an anisotropic etching process to remove the collar insulating layer 817 aligned with the top surface of the third pad layer 805 and the top surfaces of the plurality of recessed dummy layers 813. Subsequently, the plurality of recessed dummy layers 813 and the plurality of recessed doping source layers 815 may be removed by an isotropic dry etching and a wet etching process, respectively.

Figure 23:
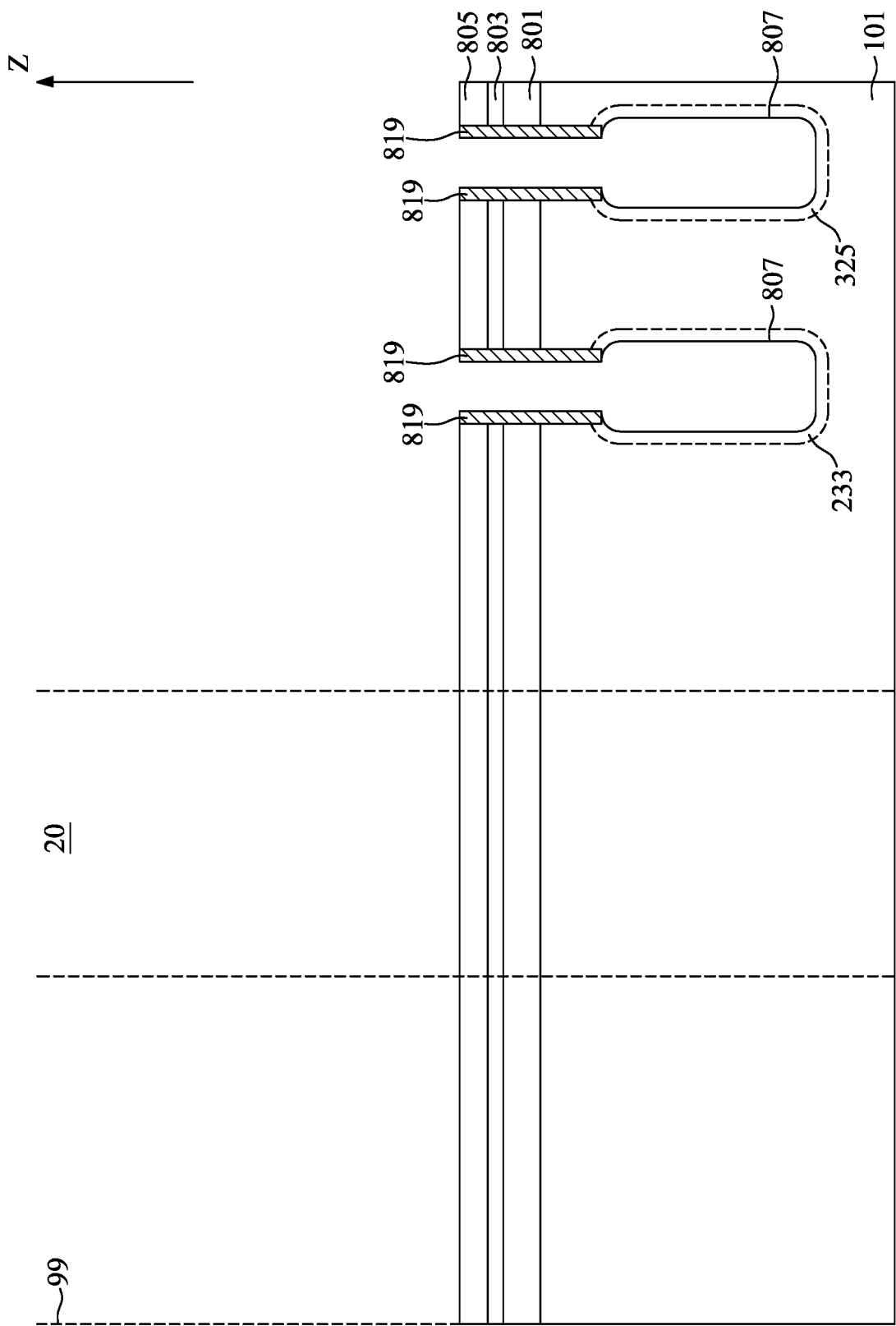
Figure 24:
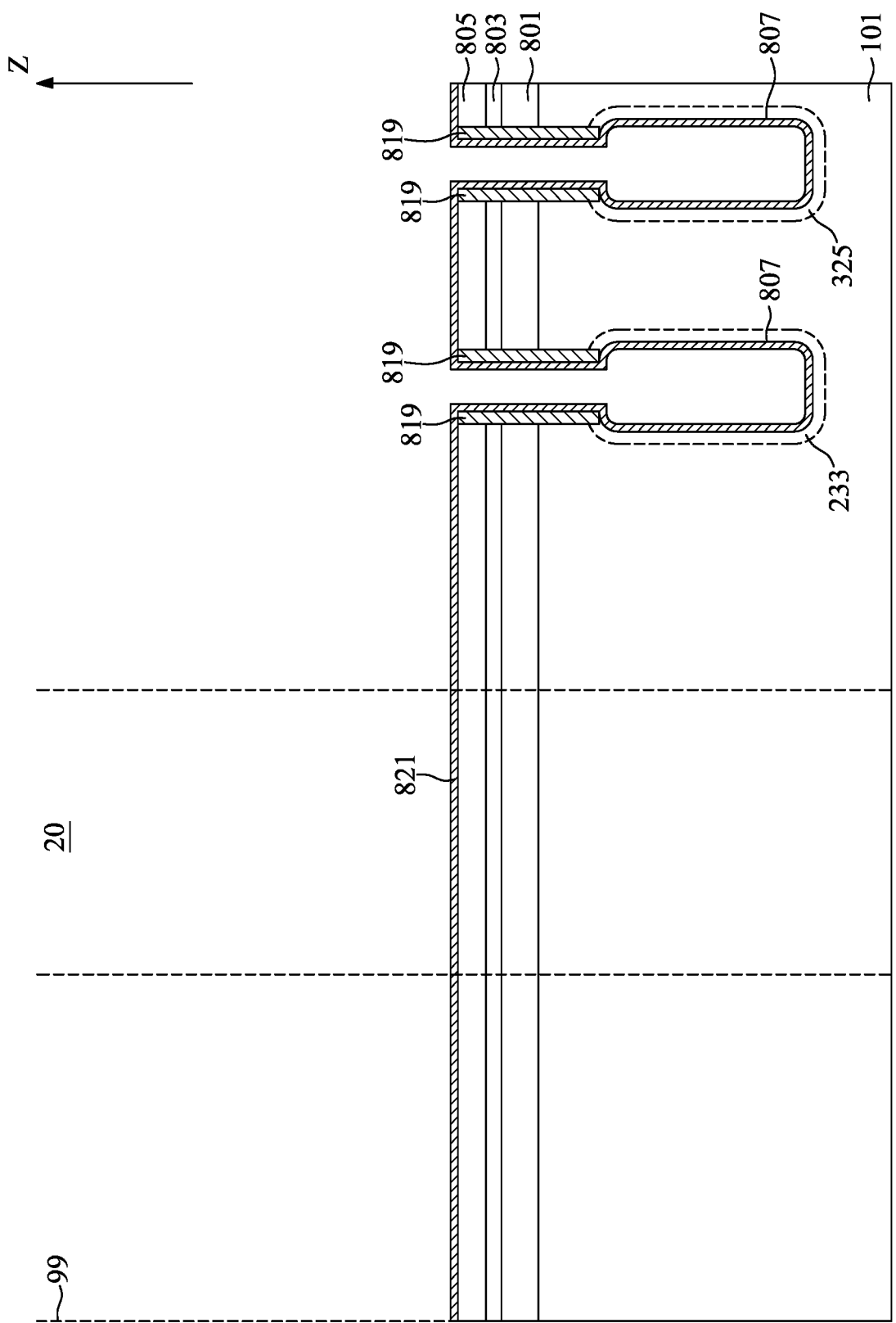
Figure 25:
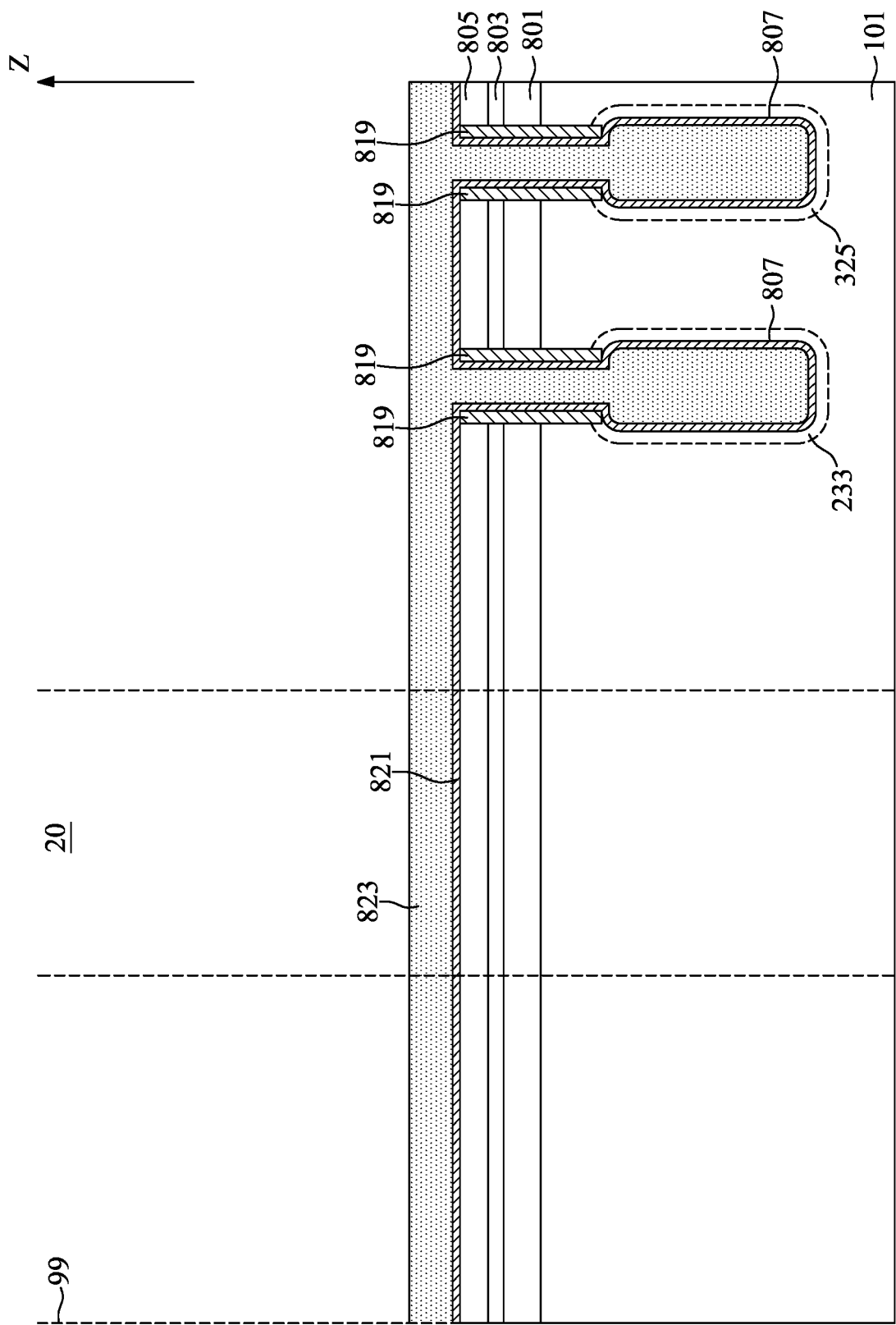
Figure 26:
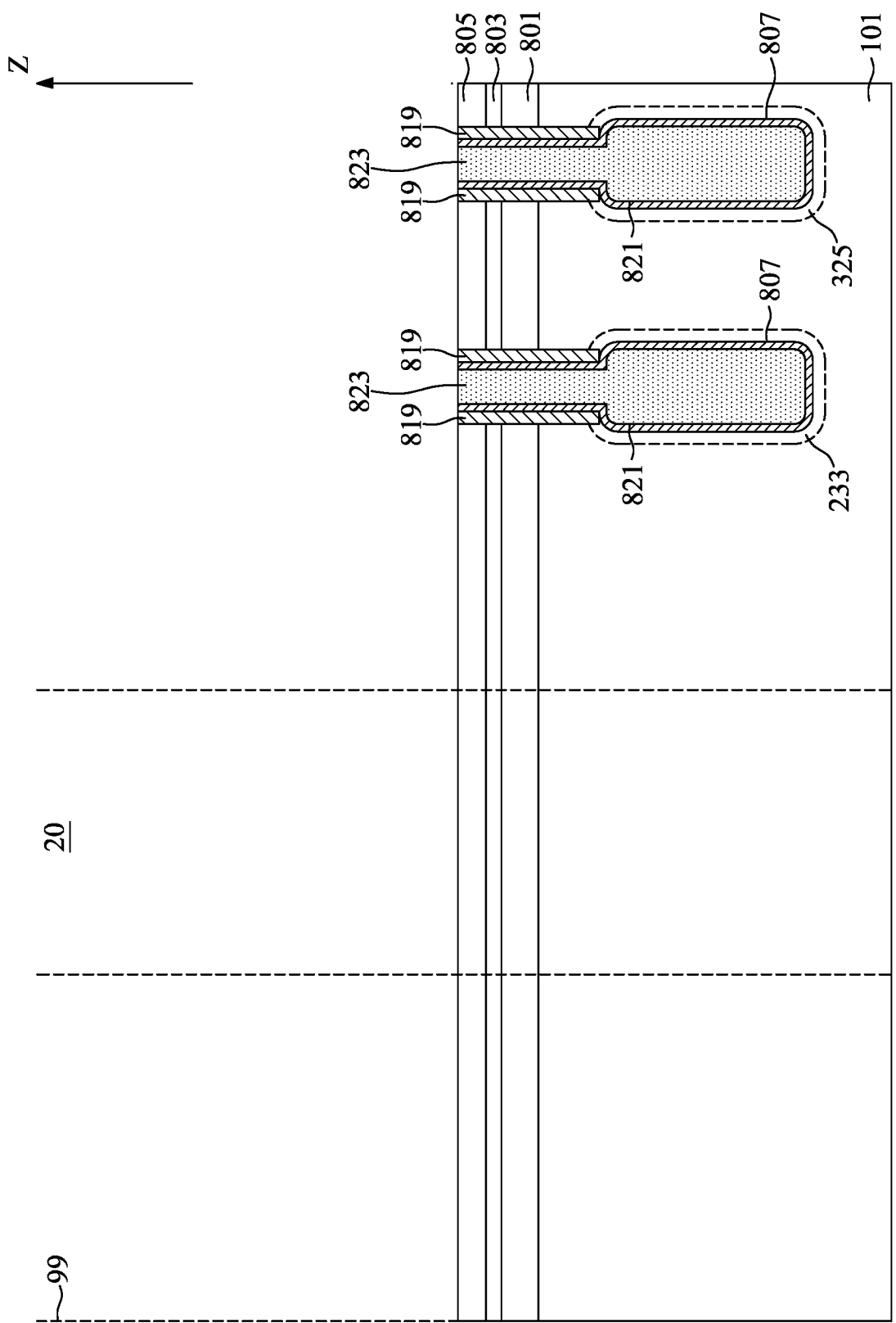
Figure 27:
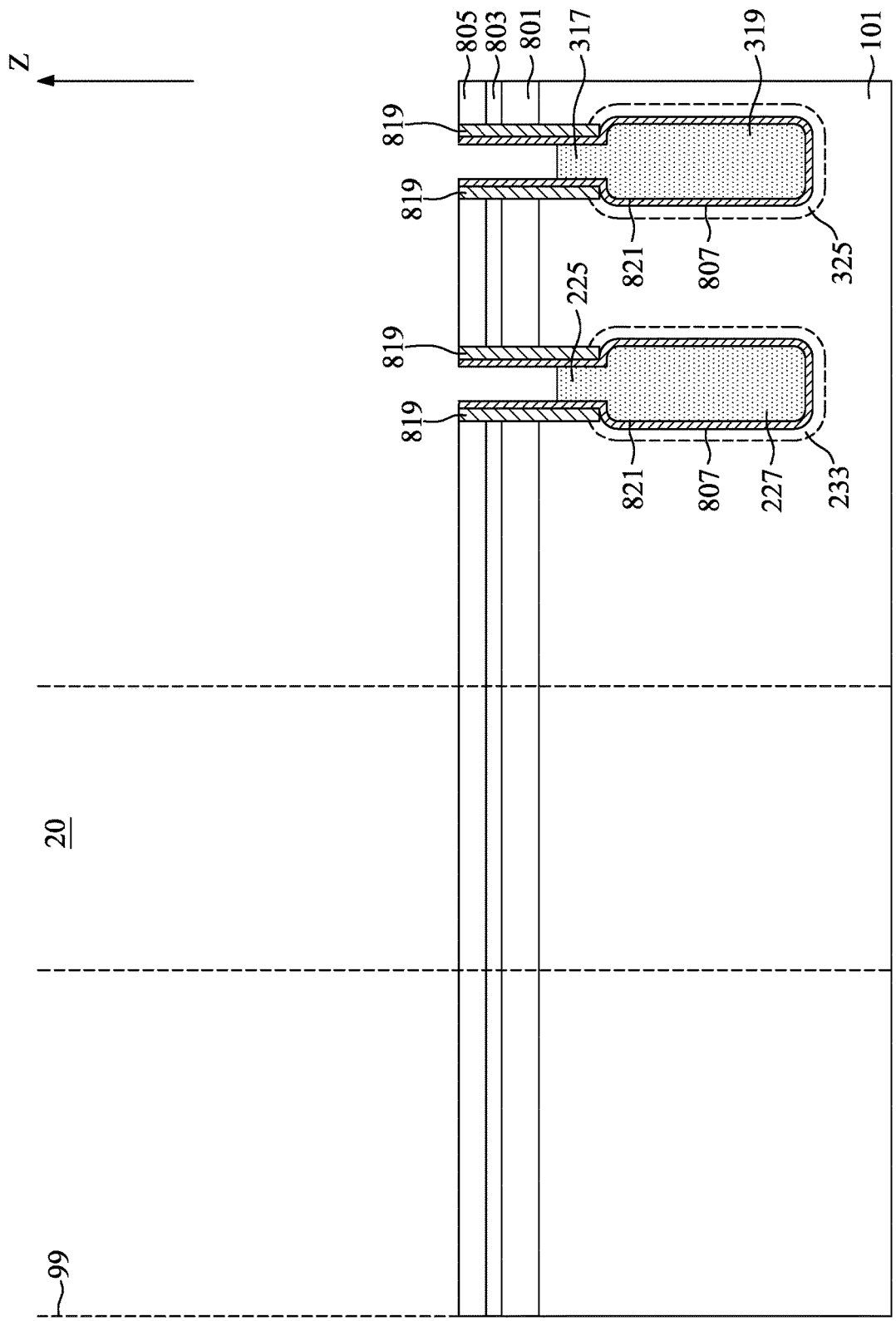

With reference to FIG. 23, a wet bottle etching process may be performed to widen the lower portions of the plurality of trenches 807. With reference to FIG. 24, a trench insulating layer 821 may be formed to align with the top surface of the third pad layer 805 and the plurality of trenches 807 by a deposition process such as chemical vapor deposition or atomic layer deposition. With reference to FIG. 25, an in-process conductive layer 823 may be formed to fill the plurality of trenches 807 and cover the trench insulating layer 821. With reference to FIG. 26, a planarization process, such as chemical mechanical polishing, may be performed to remove the third pad layer 805, a portion of the trench insulating layer 821, and a portion of the in-process conductive layer 823. After the planarization process, top surfaces of the in-process conductive layer 823 may be even with a top surface of the second pad layer 803. With reference to FIG. 27, an etch-back process may be performed to remove upper portions of the in-process conductive layer 823 and concurrently form a first collar conductive layer 225, a first bottom conductive layer 227, a second collar conductive layer 317, and a second bottom conductive layer 319.

Figure 28:
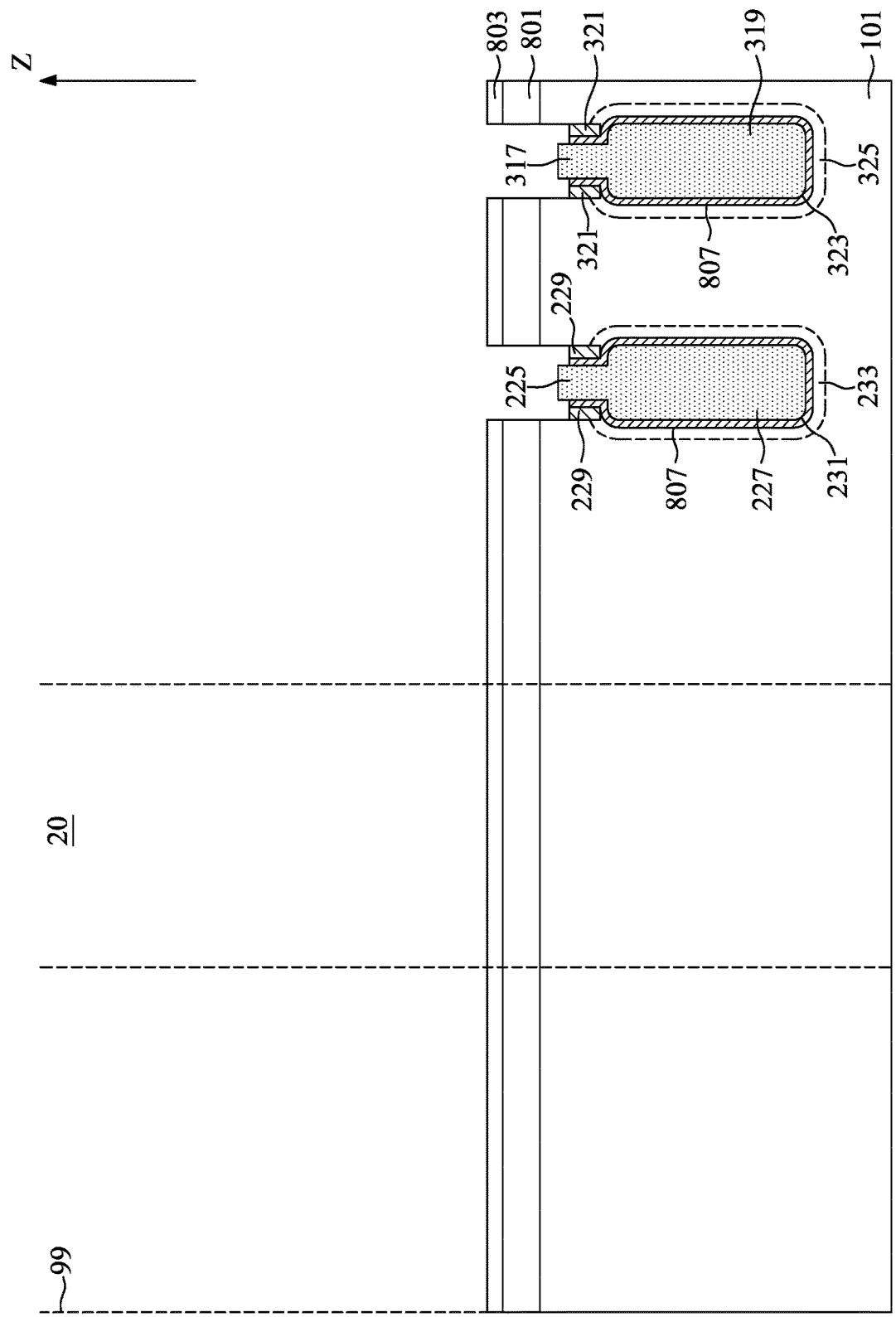
Figure 29:
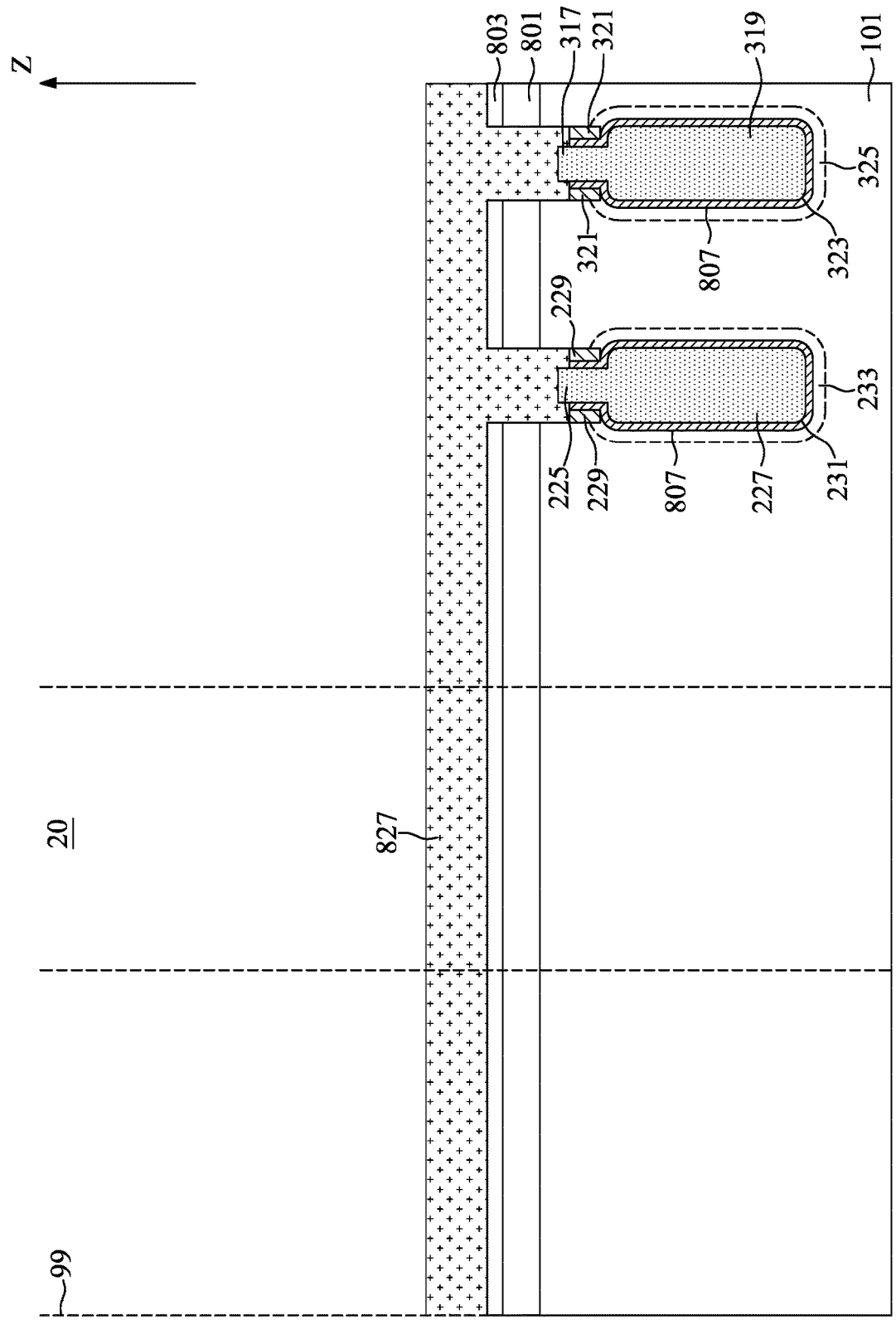

With reference to FIG. 28, a wet etching process may be performed to remove upper portions of the plurality of in-process collar insulating layers 819 and the trench insulating layer 821 and concurrently form a plurality of first insulating collars 229, a plurality of second insulating collars 321, a first capacitor insulating layer 231, and a second capacitor insulating layer 323. Top surfaces of the first collar conductive layer 225 and the second collar conductive layer 317 may be at a vertical level higher than a vertical level of top surfaces of the plurality of first insulating collars 229, the first capacitor insulating layer 231, the plurality of second insulating collars 321, and the second capacitor insulating layer 323. With reference to FIG. 29, a strap layer 827 may be formed to fill the upper portions of the plurality of trenches 807 and cover the first collar conductive layer 225, the plurality of first insulating collars 229, the first capacitor insulating layer 231, the second collar conductive layer 317, the plurality of second insulating collars 321, and the second capacitor insulating layer 323.

Figure 30:
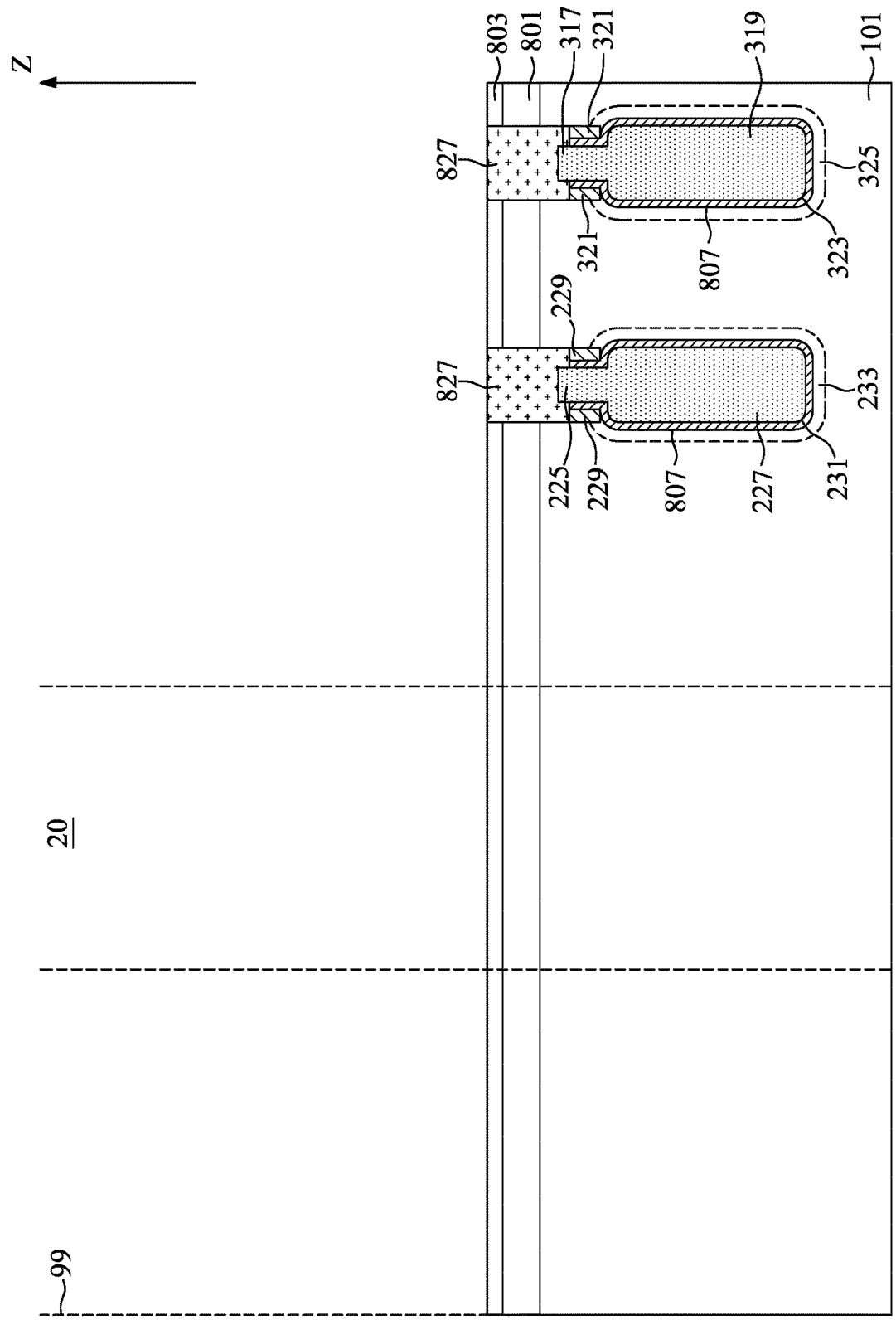
Figure 31:
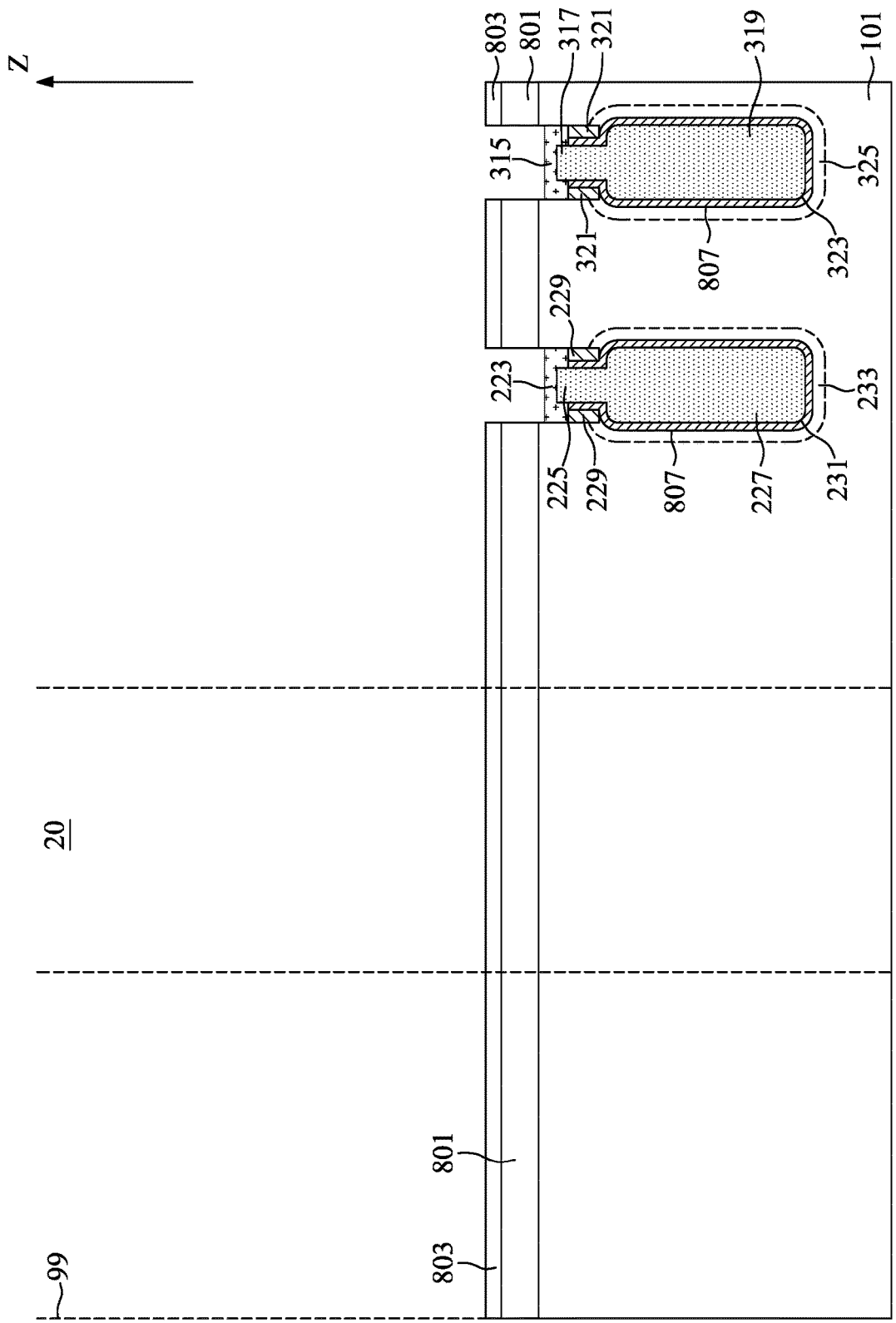
Figure 32:
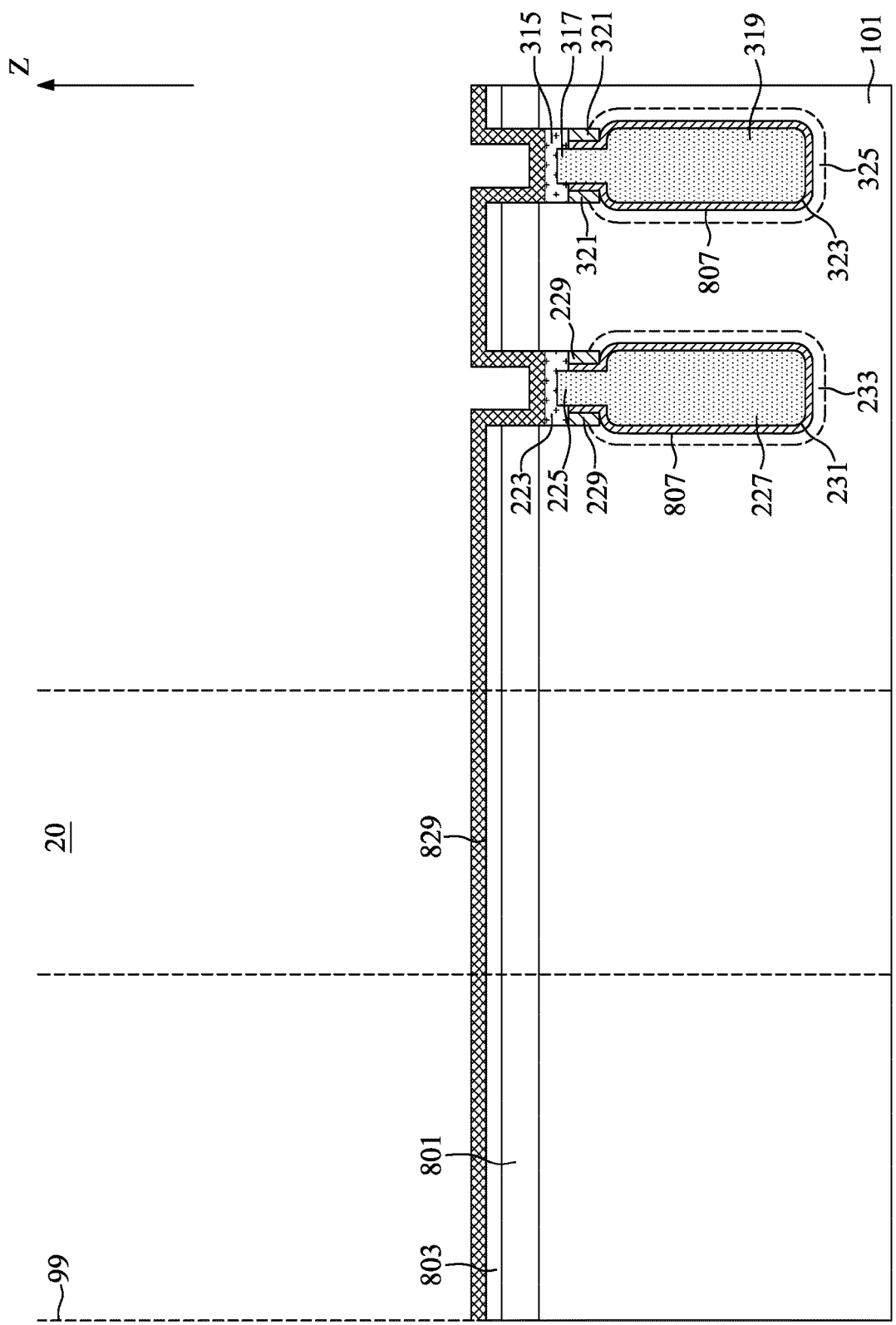

With reference to FIGS. 30 and 31, a planarization process, such as chemical mechanical polishing, may be performed until the top surface of the second pad layer 803 is exposed. Subsequently, an etch-back process may be performed to remove upper portions of the strap layer 827 in the upper portions of the plurality of trenches 807 and form a first strap layer 223 and a second strap layer 315. The first strap layer 223 may cover a top surface of one of the plurality of first insulating collars 229, a portion of the first capacitor insulating layer 231, and a portion of a top surface of the first collar conductive layer 225. The second strap layer 315 may cover a top surface of one of the plurality of second insulating collars 321, a portion of the second capacitor insulating layer 323, and a portion of a top surface of the second collar conductive layer 317. With reference to FIG. 32, a cover insulating layer 829 may be formed to align with the top surface of the second pad layer 803 and the upper portion of the plurality of trenches 807. That is, the cover insulating layer 829 may cover top surfaces of the first strap layer 223 and the second strap layer 315.

Figure 33:
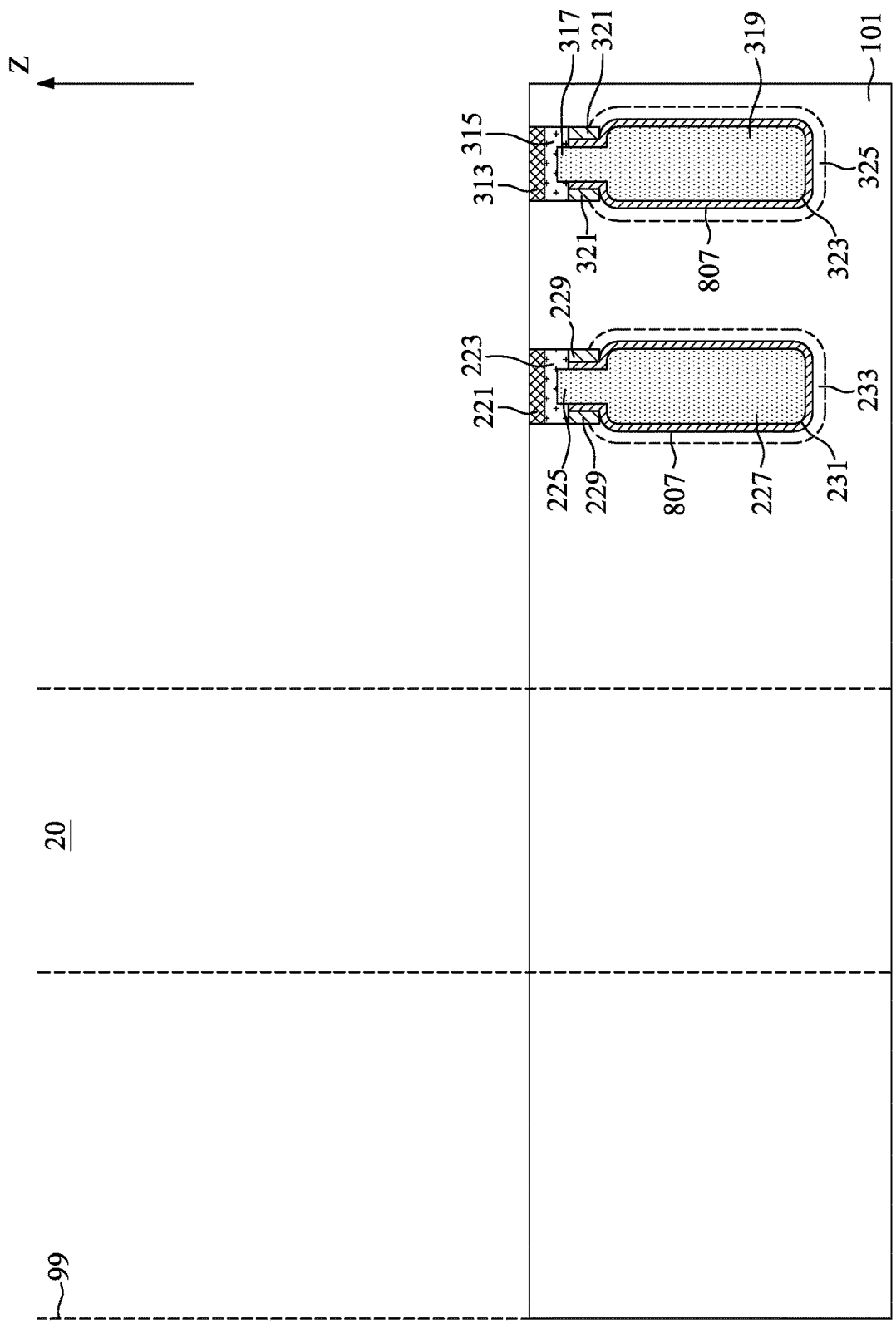
Figure 34:
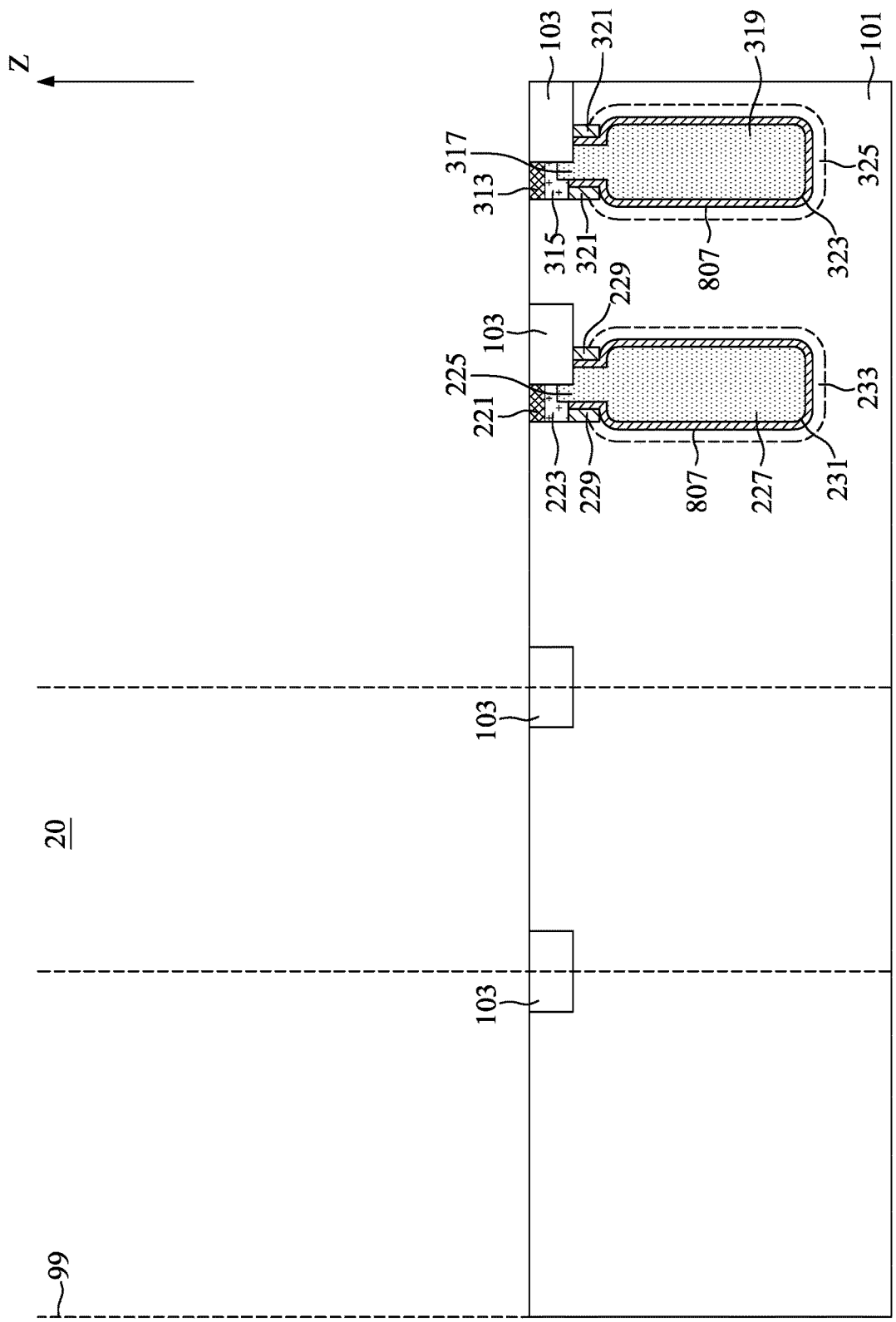
Figure 35:
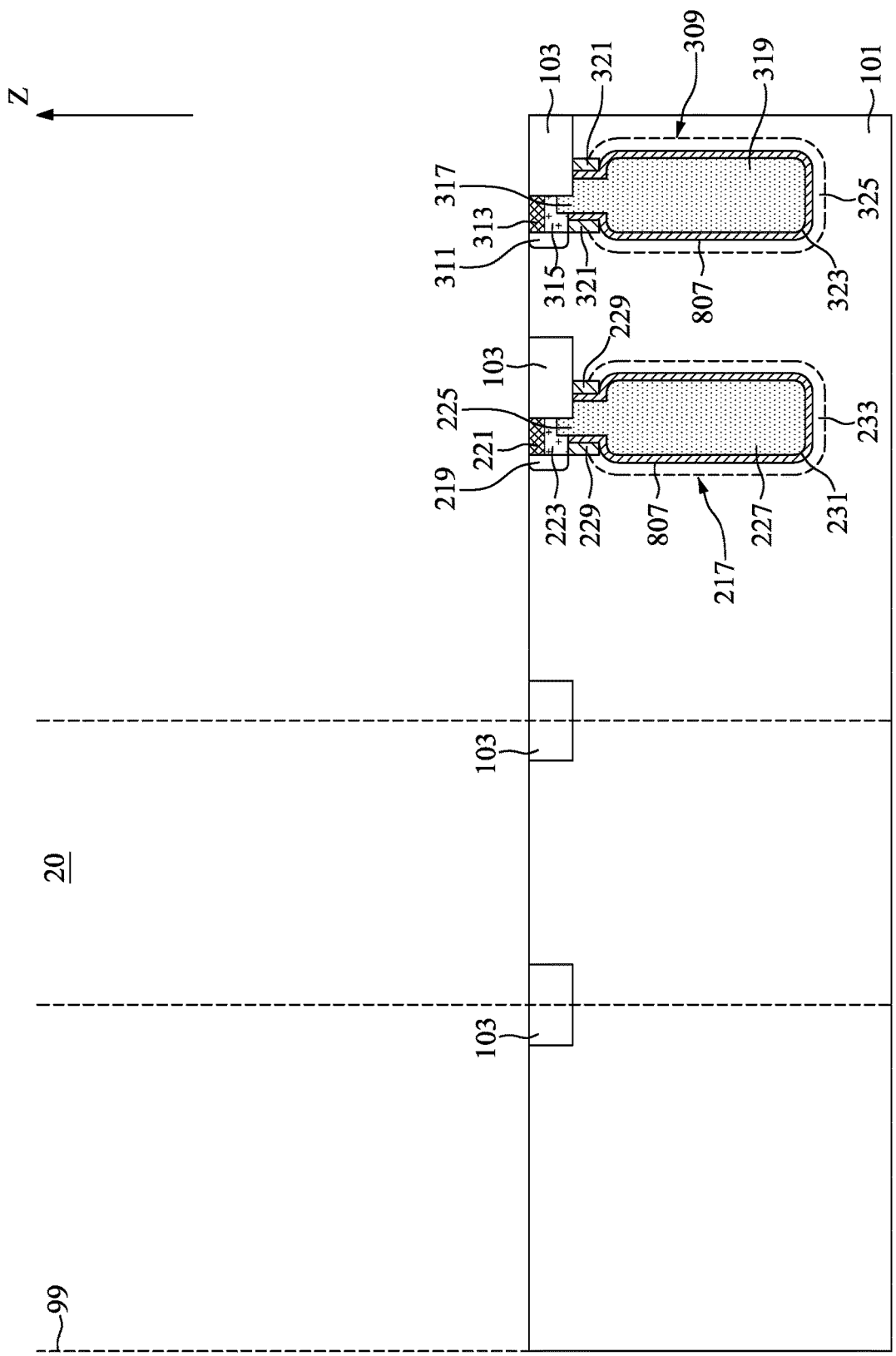

With reference to FIG. 33, a planarization process, such as chemical mechanical polishing, may be performed until the top surface of the substrate 101 is exposed and the first cover layer 221 and the second cover layer 313 are concurrently formed. With reference to FIG. 34, an isolation layer 103 may be formed in the substrate 101. Portions of the first cover layer 221, the first strap layer 223, the first collar conductive layer 225, the second cover layer 313, the second strap layer 315, and the second collar conductive layer 317 may be removed and subsequently form the isolation layer 103 in place. The isolation layer 103 may prevent the first strap layer 223 or the first collar conductive layer 225 from diffusing toward the second strap layer 315 or the second collar conductive layer 317 during the subsequent semiconductor processes. With reference to FIG. 35, dopants in the first strap layer 223 and the second strap layer 315 may be diffused out to form a first joint region 219 and a second joint region 311 through an annealing process. The first joint region 219, the first cover layer 221, the first strap layer 223, the first collar conductive layer 225, the first bottom conductive layer 227, the plurality of first insulating collars 229, the first capacitor insulating layer 231, and the first buried plate 233 together form the first capacitor unit 217. The first cover layer 221, the second cover layer 313, the second strap layer 315, the second collar conductive layer 317, the second bottom conductive layer 319, the plurality of second insulating collars 321, the second capacitor insulating layer 323, and the second buried plate 325 together form the second capacitor unit 309.

Figure 36:
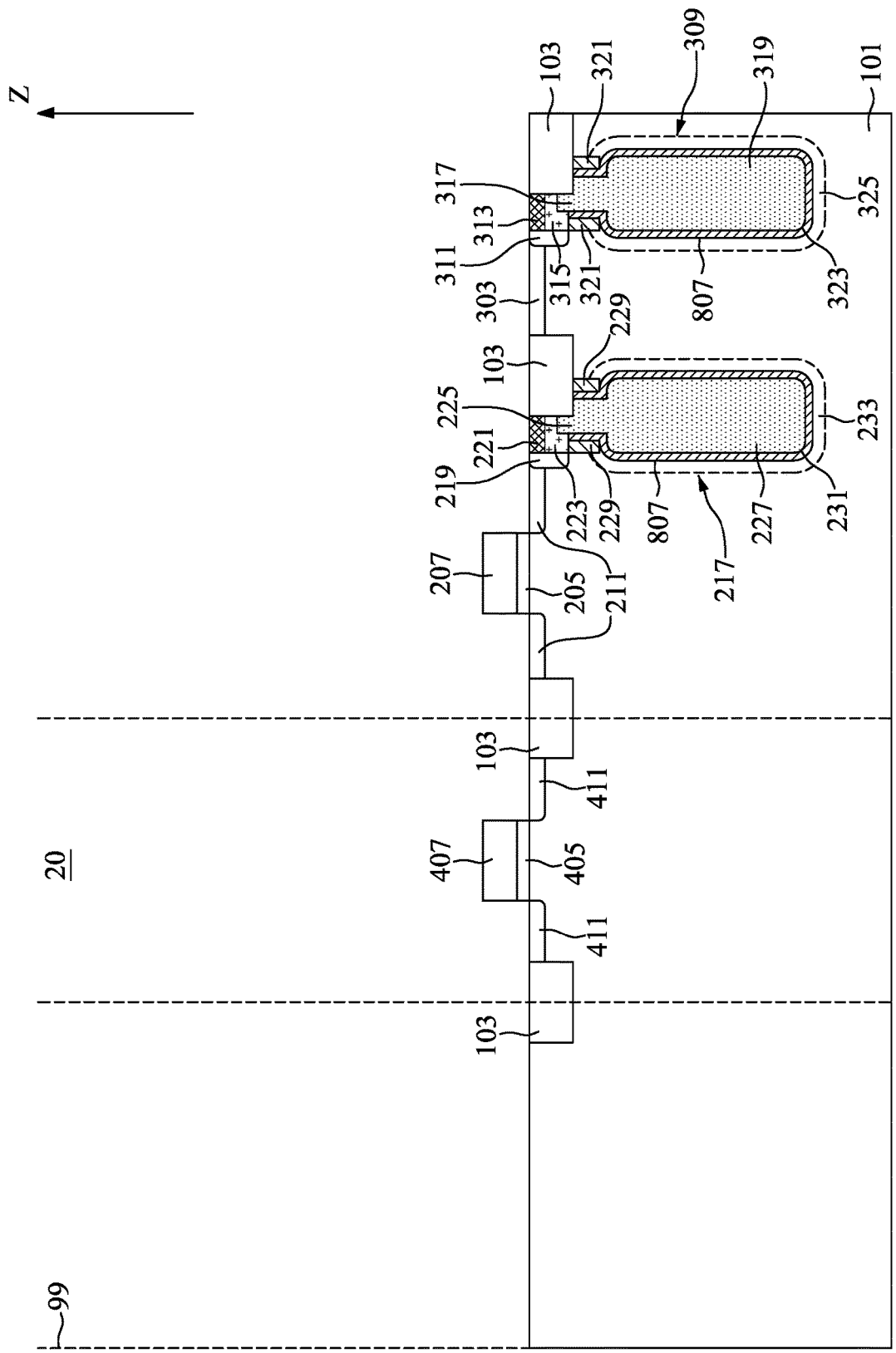

With reference to FIGS. 14 and 36 to 39, at step S17, in the embodiment depicted, a first switch unit 203 may be formed adjacent to the first capacitor unit 217, a dummy switch unit 403 may be formed adjacent to the first switch unit 203, a connecting doped region 303 may be formed in the substrate 101, and a connecting contact 305 and a connecting conductive layer 307 may be formed above the substrate 101. With reference to FIG. 36, a first switch unit insulating layer 205 and a dummy switch unit insulating layer 405 may be respectively correspondingly formed on the substrate 101. Subsequently, a first switch unit conductive layer 207 and a dummy switch unit conductive layer 407 may be respectively correspondingly formed on the first switch unit insulating layer 205 and the dummy switch unit insulating layer 405. An implantation process may be performed to form the plurality of first switch unit doped regions 211, the plurality of dummy switch unit doped regions 411, and the connecting doped region 303 in the substrate 101.

Figure 37:
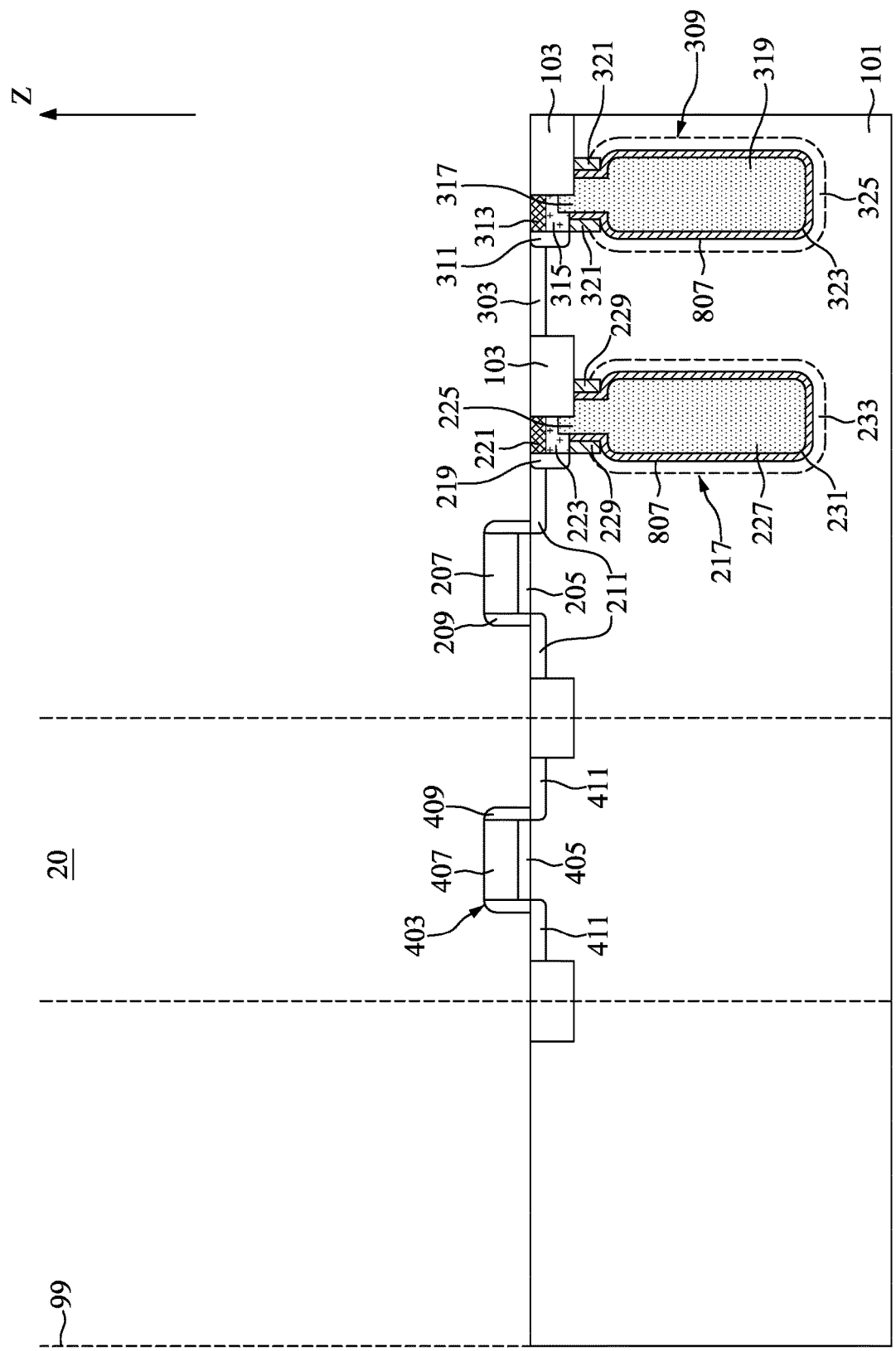
Figure 38:
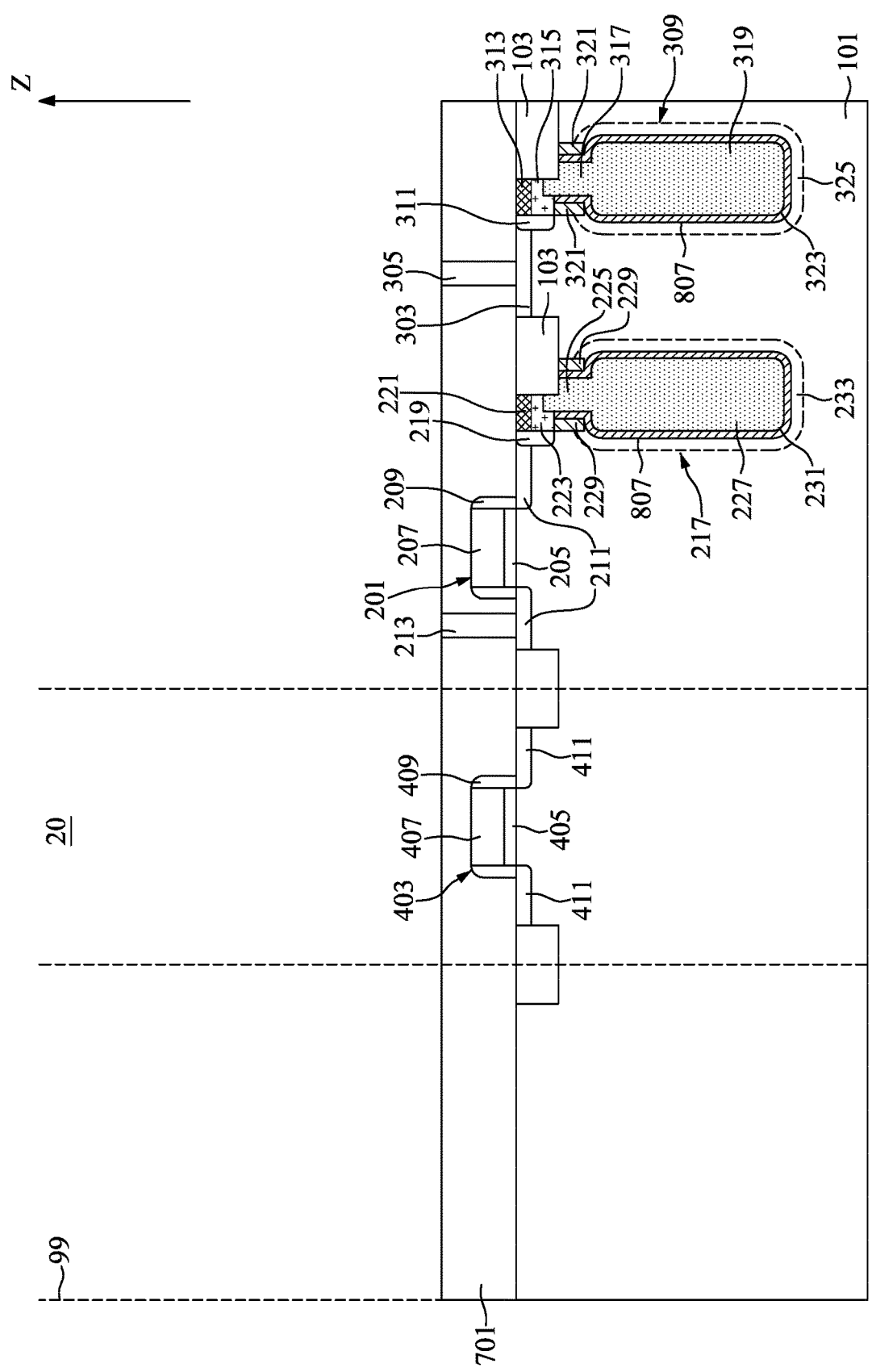

With reference to FIG. 37, a plurality of first switch unit spacers 209 and a plurality of dummy switch unit spacers 409 may be formed on the substrate 101 by depositing an insulating layer over the substrate 101 and subsequently performing an anisotropic etching process. The plurality of first switch unit spacers 209 may be attached to sidewalls of the first switch unit conductive layer 207 and the plurality of first switch unit spacers 209. The plurality of dummy switch unit spacers 409 may be attached to sidewalls of the dummy switch unit insulating layer 405 and the plurality of dummy switch unit spacers 409. With reference to FIG. 38, a first insulating film 701 may be formed on the substrate 101 and may cover the first switch unit conductive layer 207, the plurality of first switch unit spacers 209, the dummy switch unit conductive layer 407, and the plurality of dummy switch unit spacers 409. A first switch unit contact 213 and a connecting contact 305 may be formed in the first insulating film 701 and respectively correspondingly electrically connected to one of the plurality of first switch unit doped regions 211 and the connecting doped region 303.

Figure 39:
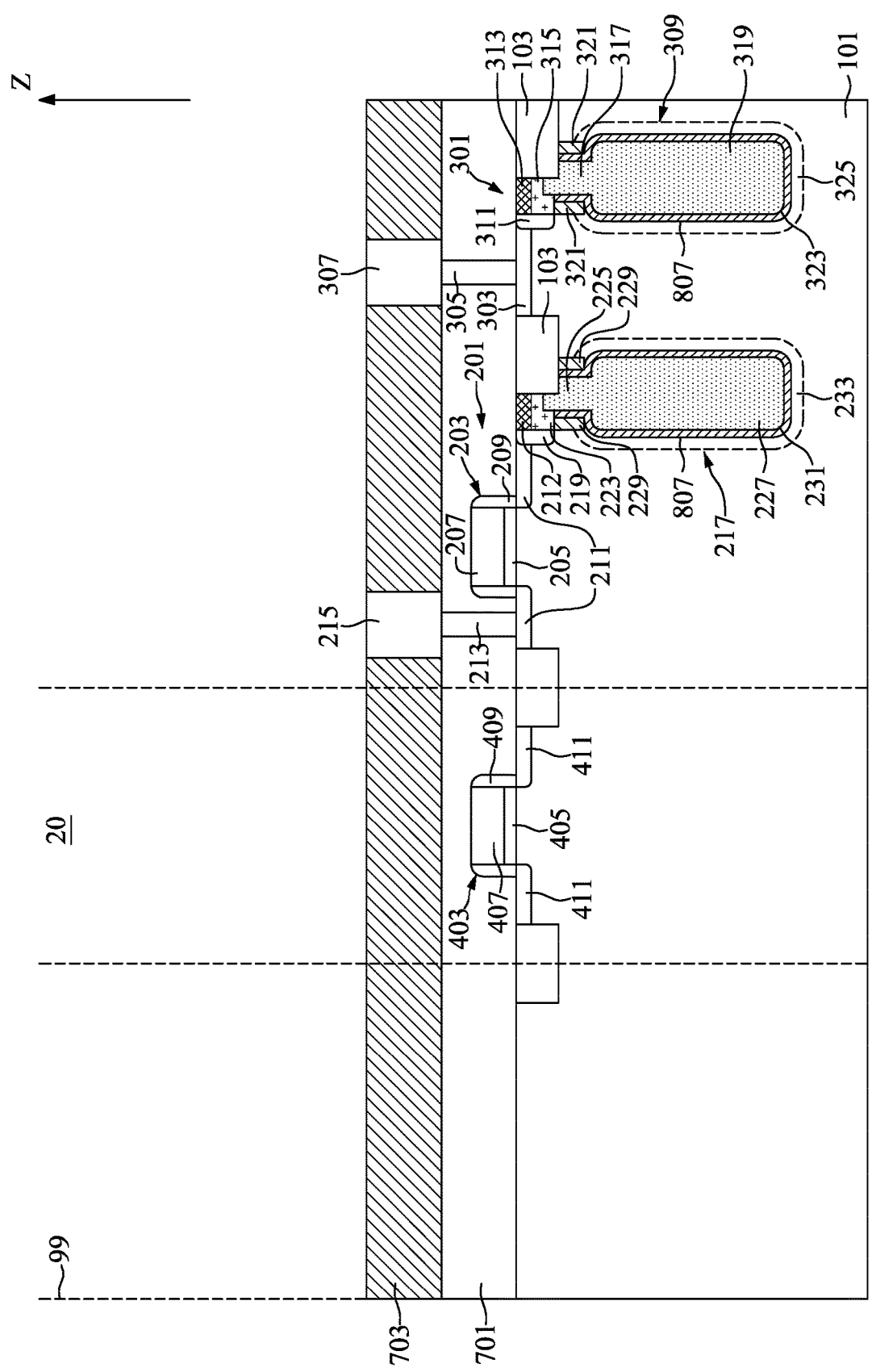

With reference to FIG. 39, a second insulating film 703 may be formed on the first insulating film 701. A first switch unit conductive line 215 and a connecting conductive layer 307 may be formed in the second insulating film 703 and respectively correspondingly electrically connected to the first capacitor insulating layer 231 and the connecting contact 305. The first switch unit insulating layer 205, the first switch unit conductive layer 207, the plurality of first switch unit spacers 209, the plurality of first switch unit doped regions 211, the first switch unit contact 213, and the first switch unit insulating layer 205 together form the first switch unit 203.

Figure 40:
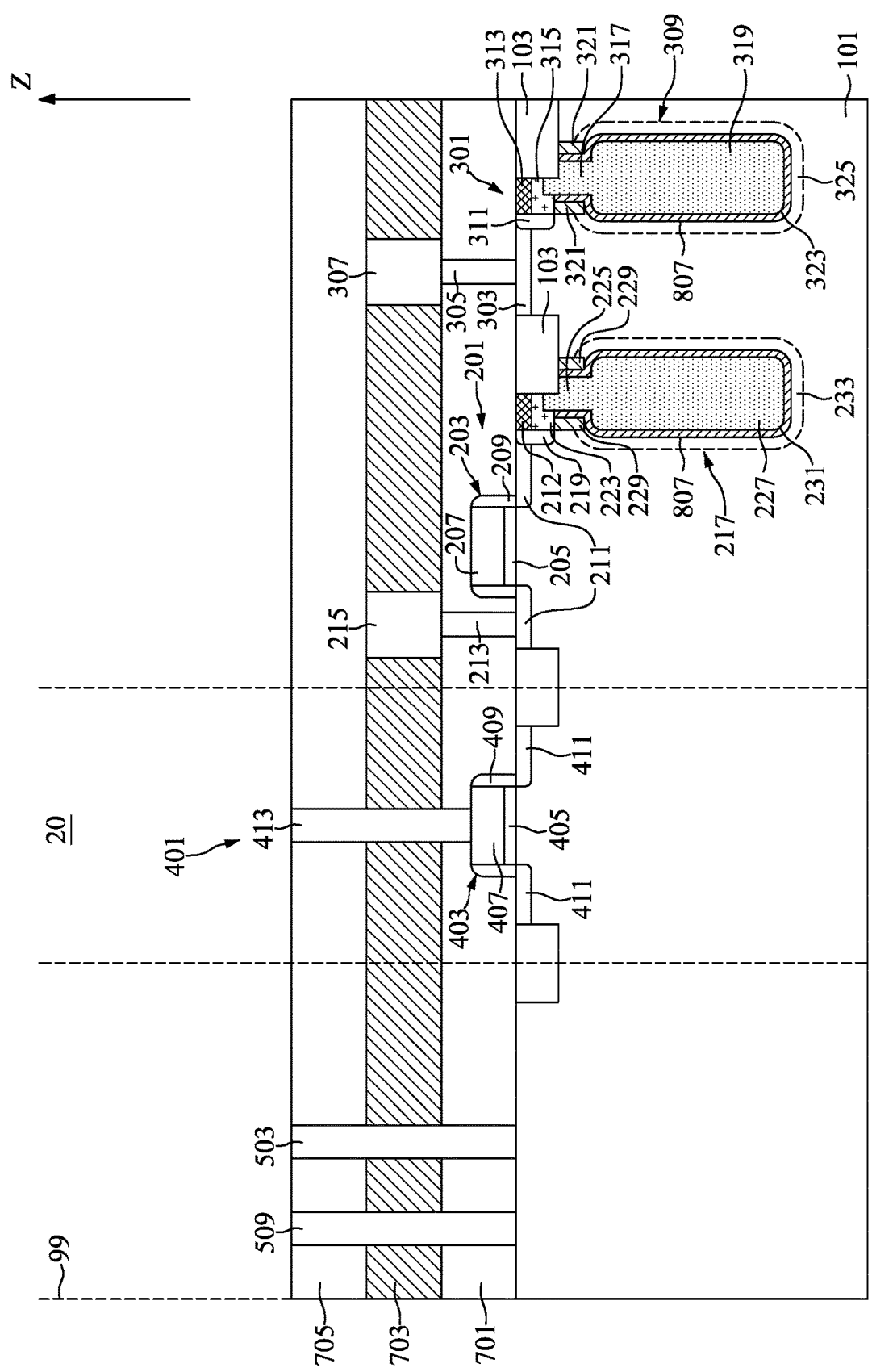
Figure 41:
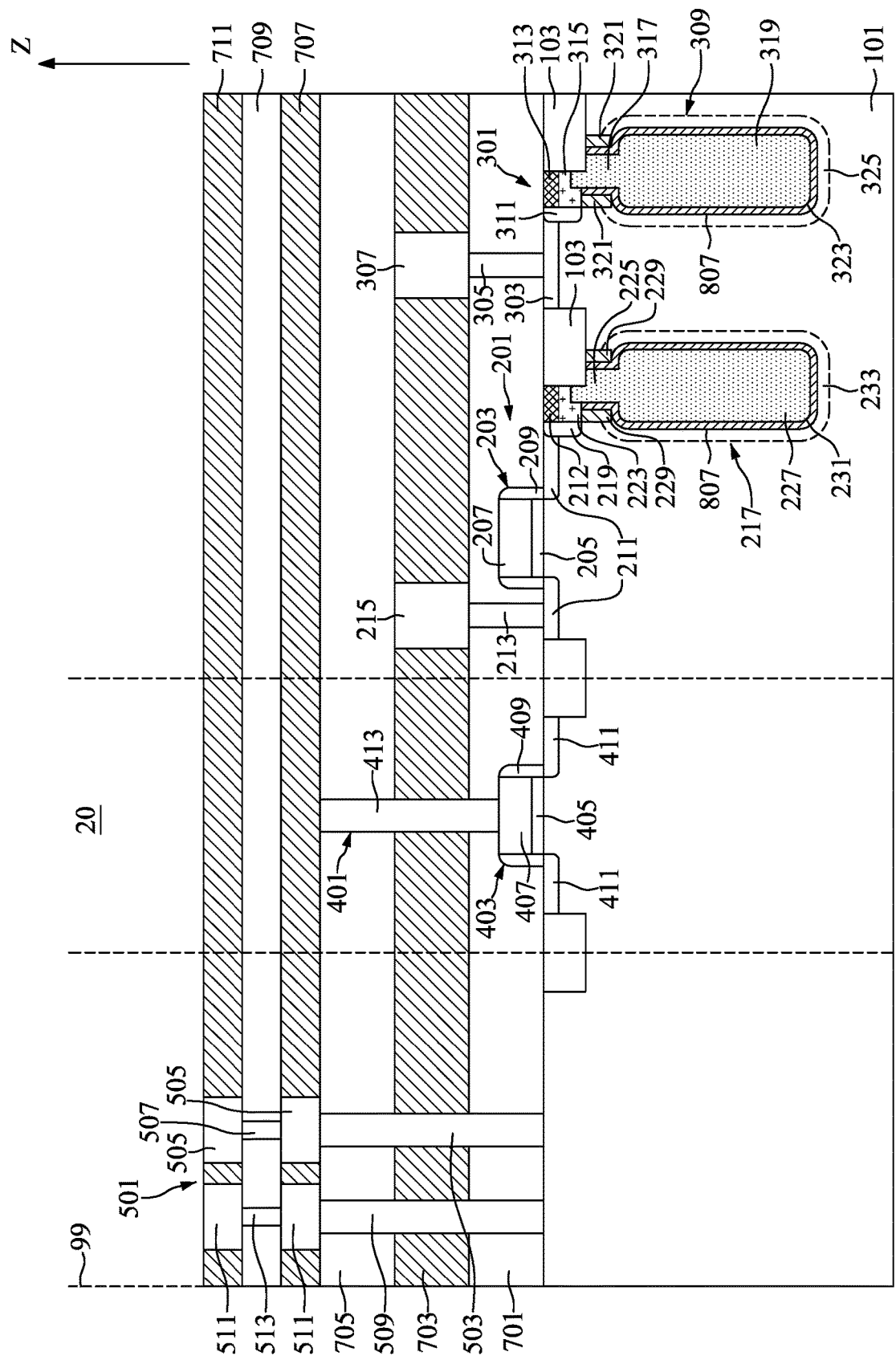

With reference to FIGS. 8, 14, 40, and 41, at step S19, in the embodiment depicted, a first dummy conductive line 413, a plurality of guard structures 501, and a seal ring 601 may be formed above the substrate 101. With reference to FIG. 40, a third insulating film 705 may be formed on the second insulating film 703. The first dummy conductive line 413, a first guard plug 503, and a second guard plug 509 may be formed extending through the third insulating film 705, the second insulating film 703, and the first insulating film 701. The first dummy conductive line 413 may be formed on the dummy switch unit conductive layer 407. With reference to FIG. 41, a fourth insulating film 707, a fifth insulating film 709, and a sixth insulating film 711 may be sequentially formed on the third insulating film 705.

With reference to FIG. 41, a plurality of first dummy guard conductive layers 505, a first dummy guard conductive via 507, a plurality of second dummy guard conductive layers 511, and a second dummy guard conductive via 513 may be respectively correspondingly formed among the fourth insulating film 707, the fifth insulating film 709, and the sixth insulating film 711. The dummy switch unit 403 and the first dummy conductive line 413 together form the plurality of stress-dissipating structures 401. The first guard plug 503, the plurality of first dummy guard conductive layers 505, the first dummy guard conductive via 507, the second guard plug 509, the plurality of second dummy guard conductive layers 511, and the second dummy guard conductive via 513 together form the plurality of guard structures 501. With reference to FIG. 8, the seal ring 601 may be formed above the substrate 101 and between the plurality of stress-dissipating structures 401 and the plurality of guard structures 501 by a single step etch, multi-step etch, laser bombardment, or the like.

Due to the design of the semiconductor device 1 of the present disclosure, it is possible to detect cracks electrically while the electrical characteristics are tested, and the efficiency of manufacturing the semiconductor device may be thereby improved. In addition, the electrical crack-detecting capacity of the semiconductor device 1 may also be used to detect latent damage which is difficult to detect by visual inspection. In addition, it is also possible to perform semiconductor device sorting with more consistency, more certainty and greater ease. Furthermore, it is also possible to eliminate the visual inspection process. As a result, the semiconductor device of the present disclosure may reduce the number of inspectors and shorten the inspection process, thus greatly reducing cost.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate; and
   a first crack-detecting structure positioned in the substrate and comprising a first capacitor unit;
   wherein the first capacitor unit comprises a first bottom conductive layer positioned in the substrate, a first capacitor insulating layer surrounding the first bottom conductive layer, and a first buried plate surrounding the first capacitor insulating layer;
   a plurality of stress-dissipating structures positioned above the substrate and next to the first crack-detecting structure;
   a plurality of guard structures positioned above the substrate and adjacent to the plurality of stress-dissipating structures;
   a seal ring positioned on the substrate and between the plurality of stress-dissipating structures and the plurality of guard structures;
   wherein the first crack-detecting structure further comprises a first switch unit positioned adjacent to the first capacitor unit and electrically coupled to the first capacitor unit.

2. The semiconductor device of claim 1, wherein the first switch unit comprises a first switch unit insulating layer positioned on the substrate, a first switch unit conductive layer positioned on the first switch unit insulating layer, a plurality of first switch unit spacers attached to sidewalls of the first switch unit insulating layer and sidewalls of the first switch unit conductive layer, and a plurality of first switch unit doped regions positioned in the substrate and adjacent to two edges of the first switch unit insulating layer.

3. The semiconductor device of claim 2, wherein the first capacitor unit further comprises a first joint region connected to one of the plurality of first switch unit doped regions and positioned above the first bottom conductive layer.

4. The semiconductor device of claim 3, wherein each one of the plurality of stress-dissipating structures comprises a dummy switch unit positioned on the substrate and a first dummy conductive line positioned on the dummy switch unit.

5. The semiconductor device of claim 3, wherein each one of the plurality of stress-dissipating structures has a rectangular shape and extends along a first direction, wherein the plurality of stress-dissipating structures are separate from each other and lengths of the plurality of stress-dissipating structures are sequentially decreased along a second direction perpendicular to the first direction.

6. A semiconductor device, comprising:
   a substrate;
   a first crack-detecting structure positioned in the substrate and comprising a first capacitor unit, wherein the first capacitor unit comprises a first bottom conductive layer positioned in the substrate, a first capacitor insulating layer surrounding the first bottom conductive layer, and a first buried plate surrounding the first capacitor insulating layer;
   a second crack-detecting structure positioned next to the first crack-detecting structure and comprising a second capacitor unit, wherein the second capacitor unit comprises a second bottom conductive layer positioned next to the first bottom conductive layer, a second capacitor insulating layer surrounding the second bottom conductive layer, and a second buried plate surrounding the second capacitor insulating layer; and
   a connecting doped region positioned in the substrate and between the first capacitor unit and the second capacitor unit, wherein the connecting doped region is electrically coupled to the second capacitor unit;
   wherein the first capacitor unit further comprises a first collar conductive layer positioned on the first bottom conductive layer, wherein the first capacitor insulating layer is attached to lower portions of sidewalls of the first collar conductive layer.

7. The semiconductor device of claim 6, wherein the first capacitor unit further comprises a plurality of first insulating collars adjacent to the first collar conductive layer and attached to sidewalls of the first capacitor insulating layer.

8. The semiconductor device of claim 7, wherein the first capacitor unit further comprises a first strap layer positioned on the first collar conductive layer.

9. The semiconductor device of claim 8, wherein the first capacitor unit further comprises a first cover layer positioned on the first strap layer, wherein a top surface of the first cover layer is even with a top surface of the substrate.

10. The semiconductor device of claim 9, further comprising a connecting contact positioned above the connecting doped region and electrically coupled to the connecting doped region.

11. The semiconductor device of claim 10, further comprising a connecting conductive layer positioned above the connecting contact and electrically coupled to the connecting doped region.

12. The semiconductor device of claim 11, further comprising an isolation layer positioned in the substrate and electrically insulating the connecting doped region and the first collar conductive layer.

\* \* \* \* \*